(12) United States Patent
Ota

(10) Patent No.: US 6,406,820 B1
(45) Date of Patent: Jun. 18, 2002

(54) EXPOSURE METHOD FOR A PROJECTION OPTICAL SYSTEM

(75) Inventor: Kazuya Ota, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/655,366

(22) Filed: Sep. 5, 2000

Related U.S. Application Data

(63) Continuation of application No. PCT/JP99/00988, filed on Mar. 2, 1999.

(30) Foreign Application Priority Data

Mar. 2, 1998 (JP) .............................. 10-066273

(51) Int. Cl.$^7$ ............................... G03F 9/00; G03C 5/00
(52) U.S. Cl. ......................... 430/30; 430/296; 430/942
(58) Field of Search ........................... 430/30, 296, 942

(56) References Cited

U.S. PATENT DOCUMENTS 5,008,702 A    4/1991   Tanaka et al. ................. 355/52
5,879,842 A  * 3/1999   Okino .......................... 430/30

FOREIGN PATENT DOCUMENTS

| JP | 2-072362 | 3/1990 |
|----|----------|--------|
| JP | 6-349706 | 12/1994 |
| JP | 9-199398 | 7/1997 |

* cited by examiner

Primary Examiner—Christopher G. Young
(74) Attorney, Agent, or Firm—Oblon, Spivak, McClelland, Maier & Neustadt, P.C.

(57) ABSTRACT

When a mask is irradiated obliquely with light from a lighting system, the light reflected from the mask is projected onto a wafer through a projection optical system, and the pattern of the mask is transferred to the wafer. If the magnification of the projection optical system changes because of a vertical movement of the mask, a control unit detects the projection position of the mask pattern image on a stage by an aerial image sensor and also detects a mark on the aerial image sensor by a mark detector so as to determine the baseline of the mark detector. Thus, the positional shift of the projection position of the mask pattern image on the wafer due to the change in magnification is corrected to sufficiently restrict or prevent alignment inaccuracy associated with the change in magnification.

28 Claims, 17 Drawing Sheets

EXPOSURE METHOD FOR A PROJECTION OPTICAL SYSTEM

CROSS-REFERENCE TO RELATED APPLICATIONS

This is a continuation of International Application PCT/JP99/00988, with an international filing date of Mar. 2, 1999, the entire content of which being hereby incorporated herein by reference.

BACKGROUND OF THE INVENTION

1. Field of the Invention

The present invention relates to an exposure method and apparatus, a method of making an exposure apparatus, a device, and a device manufacturing method. More particularly, the present invention relates to an exposure method and apparatus which are used when a circuit device such as a semiconductor device or liquid crystal display device is manufactured in a lithography process, a method of making an exposure apparatus, and a device and the method of manufacturing the device using the exposure method and apparatus.

2. Description of the Related Art

Currently, at the sites which manufacture semiconductor devices, circuit devices with minimum line width of about 0.3 to 0.35 $\mu$m (64 M(Mega)bit D-RAMs and the like) are mass-produced by using reduction projection exposure apparatus, so-called steppers, using the i line from mercury lamps that has a wavelength of 365 nm as an illumination light. At the same time, the introduction of exposure apparatus, which are designed to mass-produce circuit devices of the next generation that have an integration degree equivalent to those in the class of 256 Mbit and 1 G(Giga)bit D-RAMs and minimum line widths of 0.25 $\mu$m, has begun.

As the exposure apparatus for manufacturing circuit devices of the next generation, a scanning exposure apparatus based on the step-and-scan method is being developed. This apparatus uses an ultraviolet pulse laser beam with a wavelength of 248 nm from a KrF excimer laser source or an ultraviolet pulse laser beam with a wavelength of 193 nm from an ArF excimer laser source as an illumination light. A scanning exposure apparatus then linearly scans a mask or a reticle (to be generically referred to as a "reticle" hereinafter) on which a circuit pattern is drawn and a wafer serving as a photosensitive substrate, relatively to the projection field of a reduction projection optical system. This allows the transfer of the entire pattern within a shot area on the wafer by repeating the inter-shot stepping operation and the scanning exposure operation.

There is no doubt that the integration degree of semiconductor devices will further increase and will shift from 1 Gbit to 4 Gbit in the future. In this case, the device rule will become about 0.1 $\mu$m, i.e., 100 nm L/S, which gives rise to various technical issues when an exposure apparatus uses an ultraviolet pulse laser beam having a wavelength of 193 nm. The resolution of an exposure apparatus which, in turn, indicates a device rule (a practical minimum line width), is generally expressed using the following formula (1), using an exposure wavelength $\lambda$ and the numerical aperture N.A. of a projection optical system:

$$(\text{resolution}) = k\lambda/N.A. \tag{1}$$

where k, in this case, is called a k factor and is a positive constant equal to or less than 1, which varies depending on the characteristics of the resist used.

As is obvious from equation (1), in order to increase the resolution, it is extremely effective to decrease the wavelength $\lambda$. For this reason, recently, an EUV exposure apparatus using light in the soft X-ray region of 5 to 15 nm in wavelength (in this specification, this light will also be referred to as "EUV (Extreme Ultraviolet) light") as the exposure light has been developed. Such an EUV exposure apparatus has recently attracted a great deal of attention as a promising candidate for an exposure apparatus of the generation after the next, having a minimum line width of 100 nm.

In the EUV exposure apparatus, a reflection type reticle is generally used. This reflection type reticle is obliquely irradiated with illumination light, and light reflected by the reticle surface is projected on a wafer through a projection optical system. As a consequence, a pattern, which is irradiated with the illumination light in an illumination area on the reticle, is transferred onto the wafer. This EUV exposure apparatus employs a scanning exposure method, in which a ring-shaped illumination area is set on the reticle, and the reticle and wafer are scanned relative to the projection optical system, thereby sequentially transferring the entire pattern on the reticle onto the wafer through the projection optical system.

At the wavelength (5 to 15 nm) of light used in the EUV exposure apparatus, no material can efficiently transmit light without any absorption. Inevitably, a reflection type reticle must be used. In addition, since it is difficult to form a beam splitter, the reticle must be obliquely irradiated with illumination light.

For this reason, the projection optical system becomes non-telecentric on the reticle side. As a consequence, the displacement of the reticle along the optical axis appears on the wafer as a magnification change in the longitudinal direction of a ring-shaped exposure area (an area on the wafer which corresponds to the above ring-shaped illumination area on the reticle), and as a positional change in the transversal direction.

This technique will be described in more detail with numerical values. Assuming that a projection optical system having a resolution of 100 nm L/S is designed by using EUV light having a wavelength of 13 nm as exposure light, then Equation (1) can be rearranged into the following equation (2).

$$N.A. = k\lambda/(\text{resolution}) \tag{2}$$

If, for example, k=0.8, then the necessary N.A. to obtain a resolution of 100 nm L/S is N.A.=0.104 is approximately equal to 0.1. The N.A. is a value at the wafer side, and apparently, differs from that at the reticle side.

Assuming that the projection magnification of the projection optical system is ¼, which is generally used in a conventional deep ultraviolet exposure apparatus (DUV exposure apparatus) with the i line, g line, KrF excimer laser, or ArF excimer laser as exposure light, when the N.A. at the wafer side is 0.1, then the N.A. at the reticle side is 0.025, being ¼ that of the wafer side. This means, that illumination light applied to the reticle has a divergence angle of about ±25 mrad with respect to a principal ray. In order to prevent incident light and reflected light from overlapping, the minimum incident angle must be at least 25 mrad or more.

For example, referring to FIG. 17, if an incident angle $\theta$ (=outgoing angle $\theta$) is 50 mrad, a transverse shift $\epsilon$ of a circuit pattern drawn on a reticle R with respect to a Z-direction displacement $\Delta Z$ of the pattern surface of the reticle R (also referred to as "the Z-direction displacement of a reticle" as needed) can be given as:

$$\epsilon = \Delta Z \tan\theta \tag{3}$$

As is obvious from the equation (3), when, for example, the reticle R is displaced by 1 μm in the vertical direction (Z direction) as in FIG. 17, the transverse shift of an image on the reticle pattern surface becomes about 50 nm, and the image shift of 12.5 nm being ¼ the transverse shift, occurs on the wafer. The allowable overlay error in the semiconductor process of a device rule of 100 nm L/S is said to be 30 nm or less, thus an overlay error as large as 12.5 nm caused by a displacement of a reticle in the Z direction alone poses a serious problem. This is because overlay errors of about 10 nm can be caused by other factors, e.g., alignment accuracy of a reticle and wafer, wafer stage alignment accuracy including stepping accuracy, or the distortion of the projection optical system.

As described previously, when EUV light having a wavelength of 5 to 15 nm is used in the EUV exposure apparatus, no material can efficiently transmit in this bandwidth without any absorption. Inevitably, an allreflection optical system formed by only several mirrors (reflection optical elements) must be used as a projection optical system, which makes it difficult to control projection magnification and causes a serious problem.

Projection magnification is generally controlled in conventional deep ultraviolet exposure apparatus (DUV exposure apparatus) which uses KrF excimer lasers and the like as a light source by (1) changing the distances between lenses and (2) changing the pressures in closed chambers between lenses. In practice, however, it is not easy to control the projection magnification by changing the distances between the mirrors, or changing the curvatures of the mirrors as in the distances between lenses. In addition, since EUV light is absorbed by gases, the entire optical path must be under vacuum, therefore prohibiting the method of changing the air pressures in the projection optical system.

One promising method of controlling the projection magnification in an EUV exposure apparatus is utilizing the phenomenon described earlier where the reticle displacement along the optical axis appears as a magnification change in the longitudinal direction of an exposure area on a ring on a wafer. That is, a method of controlling the projection magnification by intentionally displacing the reticle in the optical axis direction of the projection optical system is promising.

For example, as in the case shown in FIG. 17, when the tilt of a light beam on the reticle side is 50 mrad, if the radius of a ring field (ring-shape illumination area) is, for example, 200 nm on the reticle side, and the reticle R moves away from the projection optical system by 1 μm, the radius of the ring field becomes (200 nm+50 nm). That is, the reticle image (pattern image) projected onto the wafer is enlarged by $(50 \times 10^{-9}) \div (200 \times 10^{-3})=0.25 \times 10^{-6}=0.25$ ppm, whereas the reticle image is reduced when the reticle R approaches the projection optical system.

A wafer is known to increase or decrease in size by 10 ppm or more relative to the original wafer size after processing. In the case above, in order to control magnification by 10 ppm, the reticle R must be vertically translated in the Z direction by $10 \div 0.25 \times 1=40$ μm. The problem, is, however, when the projection magnification is controlled 10 ppm by vertically moving the reticle by 40 μm, the displacement of the reticle appears as a transverse shift (image shift). Not only does the reticle image which is projected onto the ring-shape exposure area on the wafer expand by 10 ppm in the longitudinal direction, but also appears as a position change of 40×12.5=500 nm in the widthwise direction (scanning direction). In lithography where a line width of 100 nm is required, about ⅓ the line width, i.e., 30 nm, can be acceptable as a total overlay, therefore, an image shift of 50 nm due to magnification cannot be allowed.

Under the circumstances, with an exposure apparatus employing an optical system that is non-telecentric on the reticle side, e.g., an EUV exposure apparatus, a new technique to reliably reduce an overlay error accompanying a change in projection magnification urgently needs to be developed.

SUMMARY OF THE INVENTION

The present invention has been made in consideration of the situation above, and has as its first object to provide an exposure apparatus that can prevent or sufficiently suppress a deterioration in overlay accuracy caused by adjusting (or changing) the optical characteristics including the imaging characteristics (e.g., magnification) of a projection optical system.

It is the second object of the present invention to provide an exposure method which can prevent or sufficiently suppress a deterioration in overlay accuracy caused by adjusting (or changing) the optical characteristics including the imaging characteristics(e.g., magnification) of a projection optical system.

According to the first aspect of the present invention, there is provided a first exposure apparatus which transfers a pattern of a mask onto a substrate, comprising; an illumination system, which has a light source, and which irradiates the mask with an illumination light for exposure, a projection optical system, which is arranged between the mask and the substrate, and which projects the illumination light outgoing from the mask onto the substrate, a magnification changing unit, which changes a projection magnification of the projection optical system, a substrate stage which holds the substrate, a mark detection system, which has a photoelectric device, and which detects a mark located on the substrate stage, and a correction unit which is electrically connected to the magnification changing unit and the mark detection system, and which corrects a shift of a projection position of a pattern on the mask after a magnification change by using a baseline of the mark detection system on transferring the pattern of the mask onto the substrate, the baseline being obtained in consideration of the shift at the magnification change which is made by the magnification changing unit.

In this case, "a mark located on the substrate stage" includes an object mounted on the substrate stage, e.g., a mark located on the substrate, as well as a mark such as a reference mark located on the substrate stage itself. In this specification, the term "a mark located on the substrate stage" is used.

In addition, "the baseline amount" of the mark detection system has a meaning similar to the general meaning of this term. More specifically, the baseline amount is information about the positional relationship between the detection center of the mark detection system and the projection position of the mask pattern on the substrate stage, and is used for, for example, position control on the substrate stage (substrate). In this specification, the term "baseline amount" is used in this sense.

In the first exposure apparatus according to the present invention, when the mask is irradiated with illumination light for exposure from the illumination system, the illumination light outgoing from the mask is projected onto the substrate by the projection optical system. As a consequence, a pattern in an area on the mask illuminated with the illumination light for exposure is transferred onto the substrate. When the projection magnification of the projection optical system is changed by the magnification changing unit on transferring this mask pattern, the correction unit corrects the shift of the projection position of the mask pattern by using the baseline amount of the mark detection system which corresponds to the magnification after the change. This makes it possible to prevent or sufficiently suppress deterioration in overlay accuracy due to a change in the projection magnification.

In the first exposure apparatus according to the present invention, at least one reference mark including a specific reference mark can be provided on the substrate stage, and the exposure apparatus can further comprise a position detection system, which has a photoelectric device and which detects a positional relationship between the specific reference mark and a projection position of a pattern image of the mask on the substrate stage, and the correction unit can include a control unit, which is electrically connected to the mark detection system and the position detection system, and which calculates the baseline amount which corresponds to the magnification change, based on a result obtained by detecting the positional relationship by using the position detection system, and a result can be obtained by detecting one of the specific reference mark on the substrate stage and a different reference mark which relationship with the specific reference mark is predetermined by using the mark detection system. In this case, when the projection magnification of the magnification changing unit is changed on transferring a mask pattern, the control unit which structures a correction unit obtains the baseline amount of the mark detection system which corresponds to the magnification after the change. To obtain the amount, the controller uses the position detection system to detect a positional relationship between the specific reference mark on the substrate stage and a projection position of a pattern image of the mask on the substrate stage, and the mark detection system to detect the specific reference mark or a different reference mark (the relationship with the specific reference mark is predetermined). That is, the positional relationship between the projection position of a mask pattern image on the substrate stage and the detection center of the mark detection system is obtained. In short, after the change in magnification, the correction unit actually measures the baseline amount, and corrects the positional shift of the projection position of the pattern image of the mask on the substrate due to the change in projection magnification by using the measurement result. This therefore makes it possible to prevent or sufficiently suppress a deterioration in overlay accuracy due to a change in projection magnification.

When a baseline amount is to be actually measured after the projection magnification is changed as described above, it is preferable that the mark detection system includes a focus detection system, and the exposure apparatus further comprises an adjustment unit which adjusts a position of the substrate stage in an optical axis direction to position the mark to a focal position of the mark detection system, based on a detection result obtained by the focus detection system upon detecting a mark located on the substrate stage by using the mark detection system. In this case, in measuring a baseline amount, when the mark detection system is to be used to detect a specific reference mark on the substrate stage or a reference mark (whose relationship with the specific reference mark is predetermined) different from the specific reference mark, the reference mark can be detected by adjusting the position of the substrate stage. This adjustment is performed based on the detection result obtained by the focus detection system, in which the reference mark as a detection object is positioned at the focal position of the mark detection system. Accordingly, when alignment measurement of the substrate is performed before exposure, high-precision position control on the substrate can be performed by translating the substrate to the focal position of the mark detection system in the manner above and detecting an alignment mark on the substrate using the mark detection system.

In the first exposure apparatus according to the present invention, at least one reference mark including a specific reference mark can be provided on the substrate stage, the exposure apparatus further comprising a position detection system, which has a photoelectric device, and which detects a positional relationship between the specific reference mark and a projection position of a pattern image of the mask on the substrate stage, and the correction unit can include a memory unit which stores a baseline amount of the mark detection system, the baseline amount calculated by a detection result of the position detection system, and by a result obtained by detecting one of the specific reference mark on the substrate stage and a different reference mark whose relationship with the specific reference mark is predetermined by using the mark detection system, and a calculation unit, which is electrically connected to the memory unit and the magnification changing unit, and which corrects the baseline amount stored in the memory unit in accordance with the magnification change by calculation. In this case, the baseline amount is calculated in accordance with the detection result obtained by the position detection system and the result obtained by detecting one of a specific reference mark on the substrate stage and a different reference mark whose relationship with the specific reference mark is predetermined by using the mark detection system and is stored in the storage unit in advance. When the projection magnification of the projection optical system is changed by the magnification changing unit when transferring a mask pattern, the calculation unit structuring the correction unit corrects the baseline amount stored in the storage unit by a calculation that uses the magnification changed by the magnification changing unit. This baseline amount of correction is performed based on, for example, the relationship between a control value of the magnification changing unit and the positional shift amount of the mask pattern image on the substrate. As described above, according to the present invention, only by performing an actual baseline measurement and storing the result in the memory unit in advance, can the positional shift of the projection position of a pattern image of a mask on the substrate due to a change in projection magnification be corrected by calculation alone upon a magnification changing operation. This makes it possible to prevent or sufficiently suppress deterioration in overlay accuracy due to a change in projection magnification. In addition, throughput can be increased.

In the first exposure apparatus according to the present invention, when the projection magnification is changed by the magnification changing unit and the baseline amount of the mark detection system is to be actually measured, or when a baseline amount corresponding to the projection magnification after the change is to be obtained by correcting the baseline amount obtained in advance by calculation, if the illumination light for exposure is light in the soft X-ray region, it is preferable that the position detection system is a aerial image sensor which is provided on the substrate stage, and includes a fluorescent material, a thin film made on a surface of the fluorescent material, the thin film structured of one of a reflecting layer and an absorbing layer of the illumination light for exposure, the thin film having an opening formed which also serves as the specific reference mark, and a photoelectric conversion device which photoelectrically converts light generated from the fluorescent material, where the illumination light for exposure reaches the fluorescent material via the opening on conversion. In this case, as described above, regardless of the fact that there is no material that transmits light in the soft X-ray region in general, the position detection system, i.e., the aerial image sensor, can perform a spatial image measurement by using such light as exposure illumination light. Therefore, the positional relationship between the specific reference mark (the above opening) on the substrate stage and the projection position of the pattern image of the mask on the substrate stage can be easily detected by using this position detection system.

In the first exposure apparatus according to the present invention, various projection magnification changing methods can be used. For example, the magnification changing unit can be formed from a unit which drives the mask in an optical axis direction of the projection optical system. Not only in the case of a projection optical system that is non-telecentric on the object surface side (mask side), but also in the case of a projection optical system that is telecentric on both sides, it is practically difficult to manufacture an optical system that is perfectly telecentric (at each image height within the projection field). In either case, when a mask is driven in the optical axis direction of the projection optical system, the projection magnification (or distortion) of the projection optical system changes regardless of whether the projection optical system is a refraction optical system, reflection/refraction optical system, or reflection optical system. Therefore, the projection magnification can be easily changed by using this feature.

In the first exposure apparatus according to the present invention, if the projection optical system is an optical system which includes a reflection optical element, the magnification changing unit can be an optical characteristic changing unit which changes optical characteristics of the projection optical system. In this case, the optical characteristic changing unit may be a unit for changing the distances between a plurality of reflection optical elements, or may be a unit that changes a curvature of the reflection optical element.

In the first exposure apparatus according to the present invention, the projection optical system can be an optical system which includes a reflection optical element, and the exposure apparatus can further comprise a mask stage which holds the mask, and a driving unit, which is connected to the mask stage and which synchronously moves the mask stage and the substrate stage in a first direction perpendicular to an optical axis direction of the projection optical system, and the magnification changing unit is a unit which changes the magnification of the projection optical system in a second direction perpendicular to the optical axis direction and the first direction by driving the mask in the optical axis direction of the projection optical system via the mask stage.

In such a case, when a mask is irradiated with illumination light for exposure from the illumination system, the illumination light outgoing from the mask is projected onto a substrate by the projection optical system, and a pattern in an area on the mask which is irradiated with the illumination light is transferred onto the substrate. On transferring the mask pattern, the driving unit synchronously moves the mask stage and substrate stage in the first direction perpendicular to the optical axis direction of the projection optical system. With this operation, the entire mask pattern is transferred onto the substrate by scanning exposure. In addition, the magnification changing unit is a unit for changing the magnification in the second direction which is perpendicular to the optical axis direction of the projection optical system and the first direction. This is performed by driving the mask stage in the optical axis direction of the projection optical system. Thus, the projection magnification in the second direction can be easily controlled and the magnification adjustment in the first direction (scanning direction) can be easily implemented by controlling the synchronous speed ratio. Furthermore, the correction unit can correct the positional shift of the projection position of a pattern image of the mask on the substrate due to a change in projection magnification. Accordingly, this makes it possible to prevent or sufficiently suppress deterioration in overlay accuracy due to a change in projection magnification, as well as simplify magnification control. In this case, the illumination light for exposure is not specifically limited. For example, the illumination light can be light in the vacuum ultraviolet range. Or the projection optical system may be a reflection optical system configured by only reflection optical elements, and the mask can be a reflection type mask.

As described above, if a combination of a reflection optical system constituted by reflection optical elements alone and a reflection type mask is used, the illumination light for exposure can be light in the soft X-ray region.

The first exposure apparatus according to the present invention can further comprise: a focal position detection system which detects a position of the substrate on the substrate stage in an optical axis direction of the projection optical system; and a stage control unit, which is electrically connected to the focal position detection system, and which offsets the focal position detection system which corresponds to a driving amount of the mask in the optical axis direction by the magnification changing unit, and feedback-controls the position of the substrate stage in the optical axis direction based on a detection result obtained by the focal position detection system. In this case, the position of the substrate in the optical axis direction can be set to the focal position of the projection optical system on transferring the mask pattern by the stage control unit. In addition, in particular, when at least one reference mark including a specific reference mark is provided on the substrate stage and the apparatus further comprises a position detection system which detects the positional relationship between the specific reference mark and the projection position of the pattern image of the mask on the substrate stage, the specific reference mark can be set to the focal position of the projection optical system in detecting the positional relationship between the specific reference mark and the projection position of the pattern image of the mask on the substrate stage using the position detection unit to detect a baseline amount. This makes it possible to perform high-precision detection without any focus error, and as a consequence, the baseline amount can be obtained more accurately.

In the first exposure apparatus according to the present invention, the magnification may be changed by the magnification changing unit in accordance with a given target magnification for the purpose of correcting thermal deformation of a mask or the like. However, if the apparatus further comprises a detection unit which detects a plurality of alignment marks on the substrate by using the mark detection system prior to transfer of the pattern of the mask onto the substrate, the magnification changing unit can change the magnification based on position detection results of the plurality of alignment marks of the detection unit. In this case, the actual magnification change on the substrate is obtained based on the detection results on the alignment marks, and the projection magnification is changed by the magnification changing unit in accordance with the magnification change. This improves the overlay accuracy.

In the first exposure apparatus according to the present invention, the projection optical system may be non-telecentric on the mask side.

According to the second aspect of the present invention, there is provided a second exposure apparatus which repeatedly transfers a pattern of a mask onto a substrate, comprising: an illumination system, which has a light source and which irradiates the mask with an illumination light for exposure; a projection optical system which is arranged between the mask and the substrate and projects the illumination light for exposure outgoing from the mask onto the substrate; a substrate stage which holds the substrate; a mark detection system which has a photoelectric device and detects a mark located on the substrate stage; a judgement unit which judges whether it is necessary to update a baseline amount of the mark detection system based on a predetermined judgement condition; a baseline updating unit which is electrically connected to the judgement unit and calculates a new baseline amount when a result of the judgement unit is affirmative; and a stage control unit which is electrically connected to the judgement unit and the baseline updating unit and controls a position of the substrate stage by using the baseline amount of the mark detection system which is obtained prior to transfer of the pattern of the mask onto the substrate when the result of the judgement unit is negative, and by using the new baseline amount to transfer the pattern of the mask onto the substrate when the result of the judgement unit is affirmative.

According to this aspect, while mask patterns are repeatedly transferred onto a substrate, the judgement unit determines, based on a predetermined condition, whether it is necessary to update the baseline amount of the mark detection system, and the baseline updating unit calculates a new baseline amount when a result of the judgement unit is affirmative. And with the stage control unit, if the judgement result obtained by the judgement unit is negative, the stage control unit controls the position of the substrate stage by using the baseline amount of the mark detection unit which is obtained upon transferring the mask patterns onto the substrate. If the judgement result obtained by the judgement unit is affirmative, the stage control unit uses the updated baseline amount obtained upon transferring the mask patterns onto the substrate to control the substrate stage position. As the predetermined condition above, if a condition that allows estimation of the possibility that the baseline amount will vary beyond the allowable value is set, in the case that the baseline amount varies within the allowable value and the positional shift of the transferred image of the mask pattern can be neglected, then the position of the substrate stage during exposure is controlled by using the baseline amount obtained in advance. If the baseline amount is likely to vary beyond the allowable value and the positional shift of the transferred image of the mask pattern cannot be neglected, then a new baseline amount is obtained by measurement (or calculation) and the position of the substrate stage during exposure is controlled by using the newly obtained baseline amount. This makes it possible to prevent or sufficiently suppress the positional shift of the projection position of the mask pattern image on the substrate. In addition, since the baseline amount is re-measured (or re-calculated) only when required, throughput can be increased.

In this case, various conditions are conceivable as the above determination condition. For example, the judgement unit can determine whether it is necessary to update the baseline amount of the mark detection system, depending on whether the substrate, as a object onto which the mask pattern is to be transferred, is a first substrate of a lot.

According to the third aspect of the present invention, there is provided a first exposure method which transfers a pattern formed on a mask onto a substrate through a projection optical system while synchronously moving the mask and the substrate, wherein on transferring the pattern of the mask irradiated with the illumination light onto the substrate through the projection optical system, a pattern surface of the mask is irradiated with an illumination light for exposure at a predetermined incident angle, a desired projection magnification of the projection optical system in a direction perpendicular to the synchronously moving direction is set, a position of the substrate is controlled by using a baseline amount of a mark detection system which is obtained in consideration of a shift of a projection occurring when the desired projection magnification is set, and the baseline amount is used to detect an alignment mark on the substrate.

According to this aspect, in irradiating the pattern surface of a mask with exposure illumination light at a predetermined incident angle (including an incident angle of 0°) and transferring a pattern of the mask irradiated with the exposure illumination light onto a substrate through the projection optical system, when the projection magnification of the projection optical system is set to a desired value in a direction perpendicular to the synchronous moving direction, the position of the substrate is controlled by using the baseline amount of the mark detection system for detecting alignment marks on the substrate which corresponds to the baseline amount after this setting. In this case, the projection magnification in the synchronous moving direction, can be controlled by adjusting the synchronous velocity ratio between the mask and the substrate. This makes it possible to change the projection magnification and prevent deterioration in overlay accuracy due to the change.

In this case, the baseline amount corresponding to the desired projection magnification can be a baseline amount detected after the desired projection magnification is set. Alternatively, the baseline amount corresponding to the desired projection magnification can be a baseline amount previously obtained and corrected by calculation in accordance with the projection magnification. In the latter case, projection magnification can be changed, as well as prevent deterioration in overlay accuracy due to the change, without performing any baseline measurement upon exposure.

In the first exposure method according to the present invention, the mask may be a reflection type mask, and the projection optical system may be a reflection optical system.

According to the fourth aspect of the present invention, there is provided a second exposure method which transfers a pattern formed on a reflection type mask onto a substrate through a projection optical system which is configured only of a plurality of reflection optical elements while synchronously moving the reflection type mask and the substrate, wherein optical characteristics of the projection optical system are adjusted prior to transfer, and a positional relationship between a projection area of a pattern image and the substrate during the synchronous movement is adjusted so as to compensate a shift of the projection area in an image field of the projection optical system.

According to this aspect, the optical characteristics of the projection optical system are adjusted before the pattern of the reflection type mask is transferred onto the substrate through the projection optical system which includes only a plurality of reflection optical elements. This adjustment is performed by synchronously moving the reflection type mask and the substrate. On transferring the mask pattern onto the substrate, the positional relationship between the projection area of the pattern image and the substrate during synchronous movement of the reflection type mask and substrate is adjusted. This adjustment is made so as to compensate for the shift of the projection area of the pattern image within the image field of the projection optical system, which is caused by the adjustment of the optical characteristics. This therefore makes it possible to prevent or sufficiently suppress deterioration in overlay accuracy due to the adjustment of optical characteristics.

In this case, an exposure position can be determined by positional information obtained by detecting a mark on the substrate by using a mark detecting system. The positional relationship between the projection area and the substrate can be adjusted by synchronous movement of the substrate with respect to the reflection type mask, the substrate controlled in accordance with a baseline amount of the mark detection system after adjustment of the optical characteristics and the predetermined exposure position information.

In the second exposure method according to the present invention, the synchronous movement may be performed by using one of the baseline amount of the mark detection system which is measured after adjustment of the optical characteristics and the baseline amount of the mark detection system which is calculated from the adjusted optical characteristics. More specifically, if the optical characteristics greatly change after the adjustment of optical characteristics, since the baseline amount is likely to greatly change due to the adjustment of optical characteristics, the baseline amount of the mark detection system can be actually measured. In contrast, if the optical characteristics hardly change after the adjustment of optical characteristics, the baseline amount of the mark detection system, which is calculated from the adjusted optical characteristics, can be used. In the latter case, the overlay accuracy hardly deteriorates upon usage of the calculated value obtained by correcting the baseline amount before the adjustment with the change in baseline amount, which is calculated based on the relationship between the adjustment amount of optical characteristics and the baseline amount.

In the second exposure method according to the present invention, a projection magnification of the pattern image in a direction perpendicular to the synchronous moving direction of the substrate can be adjusted by moving the reflection type mask in a direction along an optical axis of the projection optical system based on at least one of a plurality of positional information obtained by detecting a plurality of marks on the substrate by using the mark detection system and a plurality of positional information obtained by detecting a plurality of marks on the reflection type mask through the projection optical system. In this case, the expansion/contraction amount of the substrate can be obtained based on a plurality of positional information, which are obtained by detecting a plurality of marks on the substrate using the mark detection system. In addition, the magnification (or magnification change) of the mask pattern image projected on the substrate can be obtained on the basis of a plurality of positional information which are obtained by detecting a plurality of marks on the reflection type mask through the projection optical system. Therefore, the projection magnification of the pattern image in the direction perpendicular to the synchronous moving direction of the substrate can be properly adjusted by moving the reflection type mask in the optical axis direction of the projection optical system. The adjustment can be made based on either the plurality of positional information which are obtained by detecting the plurality of marks on the substrate using the mark detection system or the plurality of positional information which are obtained by detecting the plurality of marks on the reflection type mask through the projection optical system.

In the second exposure method according to the present invention, the reflection type mask is irradiated with an illumination light for exposure which principal ray tilts with respect to a pattern surface of the mask, the illumination light can be either light in a soft X-ray region or a vacuum ultraviolet light, and the projection optical system can be non-telecentric on the mask side.

According to the fifth aspect of the present invention, there is provided a third exposure method which repeatedly transfers a pattern of a mask onto a substrate through a projection optical system, comprising: a first step of monitoring a change in physical quantity which becomes a factor that changes a baseline amount of a mark detection system for detecting a mark on the substrate; a second step of judging whether it is necessary to update the baseline amount of the mark detection system, which depends on whether the physical quantity exceeds a predetermined acceptable value; and a third step of obtaining a new baseline amount when a judgement result is affirmative and controlling a position of the substrate by using the new baseline amount, controlling the position of the substrate by using the baseline amount of the mark detection system when the judgement result is negative, performing exposure.

According to this aspect, in the first step, a change in a physical quantity is monitored. This physical quantity becomes a factor that changes the baseline amount of the mark detection system for detecting marks on the substrate. In the second step, depending on whether the physical quantity has exceeded the predetermined allowable value, it is judged whether it is necessary to update the baseline amount of the mark detection system. In the third step, if the judgement result is affirmative, a new baseline amount is obtained. The new baseline amount is used to control the position of the substrate. If the judgement result is negative, the previously obtained baseline amount of the mark detection system is used to control the position of the substrate, and exposure is performed. Accordingly, in the case that the physical quantity becomes a factor which changes the baseline amount of the mark detection system, and the variation in baseline amount is likely to exceed the acceptable value, hence the positional shift of the transferred image of the mask pattern cannot be neglected, a new baseline amount is obtained by measurement (or calculation) and the position of the substrate stage during exposure is controlled by using the new baseline amount. In contrast to this, when the physical quantity falls within the predetermined acceptable value and a variation in baseline amount falls within the acceptable value, the positional shift of the transferred image of the mask pattern can be neglected. Therefore, the position of the substrate stage during exposure can be controlled by using the previously obtained baseline amount. This makes it possible to prevent or sufficiently suppress the positional shift of the projection position of the mask pattern image on the substrate. In addition, the throughput can be increased since a baseline amount is re-measured (re-calculated) only when necessary.

In the third exposure method according to the present invention, various physical quantities are conceived as the physical quantity to be monitored in the first step. For example, the monitored physical quantity can be a change in the mask due to thermal expansion. In this case, the change in the mask due to thermal expansion can be estimated based on a measurement result of a temperature distribution of the mask.

In the third exposure method according to the present invention, the physical quantity monitored in the first step is an image forming characteristic of the projection optical system.

In the third exposure method according to the present invention, if the projection optical system is an optic system including a mirror, the physical quantity monitored in the first step can be a deformation amount of the mirror.

According to the sixth aspect of the present invention, there is provided a fourth exposure method which repeatedly transfers a pattern of a mask onto a substrate through a projection optical system. The method comprises: judging whether it is necessary to update a baseline amount of a mark detection system based on a predetermined judgement condition where the mark detection system detects a mark located on a substrate stage; controlling a position of the substrate stage using the baseline amount of the mark detection system which is obtained prior to transfer of the pattern of the mask onto the substrate when a result of the judgement is negative, and using a new baseline amount to transfer the pattern of the mask onto the substrate when the result of the judgement is affirmative.

According to this aspect, while the mask pattern is repeatedly transferred onto the substrate, a judgement is made on whether to update the baseline amount of the mark detecting system in accordance with a predetermined judgement condition. And, when the judgement result is negative, the position of the substrate stage is controlled by using the baseline amount of the mark detection system, which is obtained prior to transfer of the pattern of the mask onto the substrate. When the judgement result is affirmative, the position of the substrate stage is controlled by a new baseline amount obtained upon transferring of the pattern of the mask onto the substrate. Accordingly, the predetermined judgement condition (if a condition that presumably requires a judgement as to whether the baseline amount will vary in excess of the acceptable amount is identified, as described earlier) can prevent or suppress the shift of a projection position of a mask pattern as well as increase throughput since the baseline amount is re-measured (re-calculated) only when necessary.

According to the seventh aspect of the present invention, there is provided a first method of making an exposure apparatus which transfers a pattern of a mask onto a substrate, comprising: providing an illumination system which has a light source and irradiates the mask with an illumination light for exposure; providing a projection optical system which is arranged between the mask and the substrate and projects the illumination light for exposure outgoing from the mask onto the substrate; providing a magnification changing unit which changes a projection magnification of the projection optical system; providing a substrate stage which holds the substrate; providing a mark detection system which has a photoelectric device and detects a mark located on the substrate stage; and providing a correction unit which is electrically connected to the magnification changing unit and the mark detection system and corrects a shift of a projection position of the pattern of the mask after a magnification change by using a baseline amount of the mark detection system on transferring the pattern of the mask onto the substrate, the baseline amount being obtained by consideration of the shift at the magnification change which is made by the magnification changing unit.

With this method, the exposure apparatus can be made by mechanically, optically, and electrically combining an illumination system, a projection optical system, a magnification changing unit, a substrate stage, a correction unit, and other various components and adjusting them. In this case, a static type exposure apparatus such as a step-and-repeat type exposure apparatus can be made.

The method of making an exposure apparatus according to the present invention may further comprise: the step of providing a mask stage which holds the mask; and the step of providing a driving unit which synchronously moves the mask stage and the substrate stage in a first direction perpendicular to an optical axis direction of the projection optical system. In this case, a scanning exposure apparatus based on the step-and-scan method or the like can be made, which can correct image distortion characteristics by changing/adjusting the scanning velocity of the mask stage and substrate stage and the angle in between the scanning directions.

According to the eighth aspect of the present invention, there is provided a second method of making an exposure apparatus which repeatedly transfers a pattern of a mask onto a substrate, which comprises: providing an illumination system which has a light source and irradiates the mask with an illumination light for exposure; providing a projection optical system, which is arranged between the mask and the substrate, and which projects the illumination light for exposure outgoing from the mask onto the substrate; providing a substrate stage which holds the substrate; providing a mark detection system, which has a photoelectric device, and which detects a mark located on the substrate stage; providing a judgement unit which judges whether it is necessary to update a baseline amount of the mark detection system based on a predetermined judgement condition; providing a baseline updating unit, which is electrically connected to the judgement unit, and which calculates a new baseline amount when a result of the judgement unit is affirmative; and providing a stage control unit, which is electrically connected to the judgement unit and the baseline updating unit, and which controls a position of the substrate stage using the baseline amount of the mark detection system which is obtained prior to transfer of the pattern of the mask onto the substrate when the result of the judgement unit is negative, and using the new baseline amount to transfer the pattern of the mask onto the substrate when the result of the judgement unit is affirmative.

In the lithography process, a plurality of layers of patterns can be formed on a substrate with a high overlay accuracy by performing an exposure using the exposure method according to the present invention. This makes it possible to manufacture microdevices with higher degrees of integration at a high yield. Likewise, in the lithography process, a plurality of layers of patterns can be formed on a substrate with high overlay accuracy by performing exposure using the exposure apparatus according to the present invention. This makes it possible to manufacture microdevices with higher degrees of integration at a high yield. From another point of view, the present invention is a device manufacturing method using the exposure method of the present invention and the lithography system of the present invention, and a device manufactured by the manufacturing method of the present invention.

DESCRIPTION OF THE PREFERRED EMBODIMENTS

First Embodiment

The first embodiment of the present invention will be described below in reference to FIGS. 1 to 12.

Figure 1:
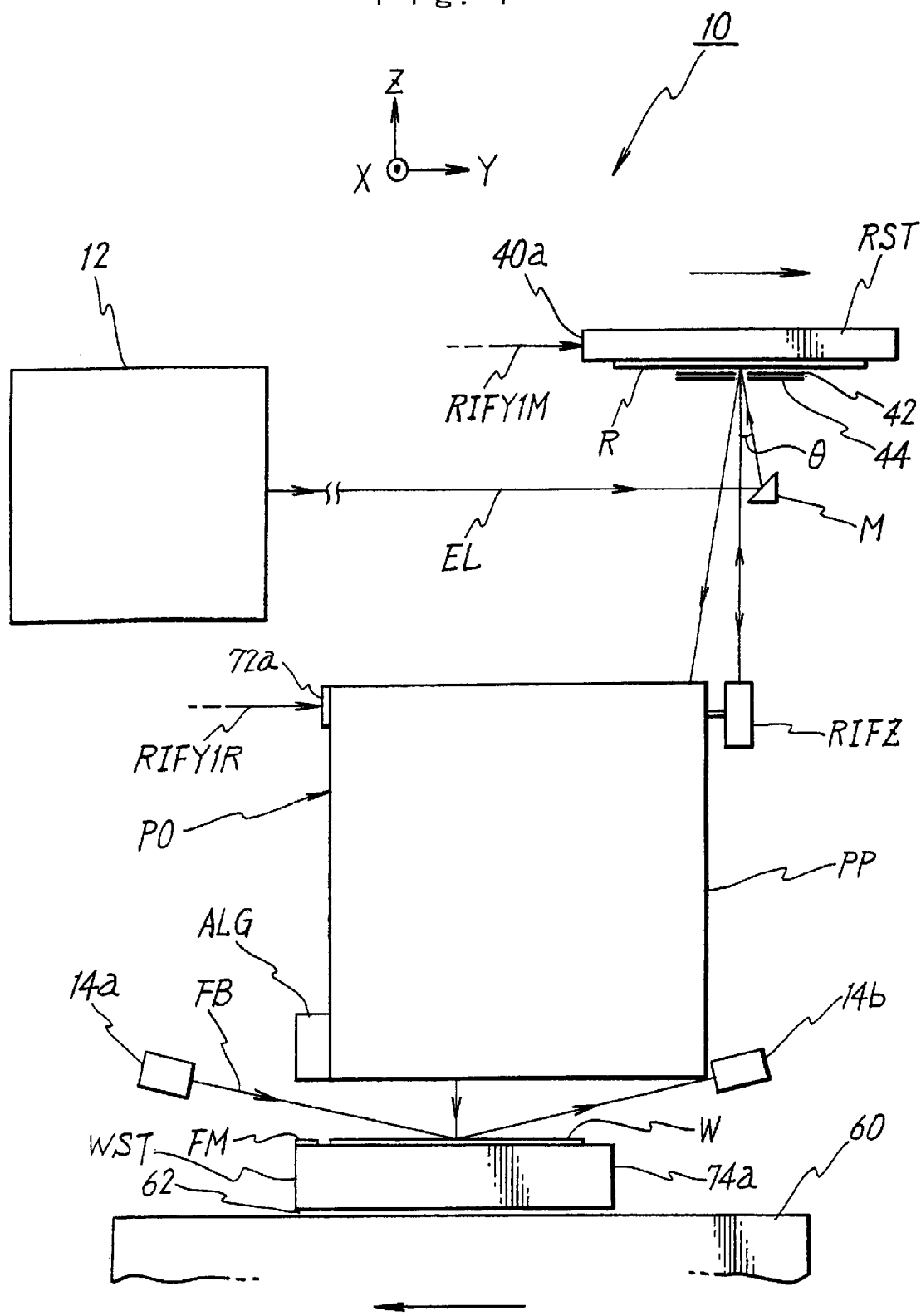
FIG. 1 is a view schematically showing the arrangement of an exposure apparatus according to the first embodiment of the present invention.

FIG. 1 schematically shows the general structure of an exposure apparatus 10 according to the first embodiment. The exposure apparatus 10 is a projection exposure apparatus designed to perform exposure operations by the step-and-scan method using light (EUV light) in the soft X-ray region with a wavelength from 5 nm to 15 nm as the exposure illumination light EL. In this embodiment, as will be described later, a projection optical system PO for vertically projecting the reflected light beam from a reticle R as a mask onto a wafer W is used. The projecting direction, therefore, of the illumination light EL projected from the projection optical system PO onto the wafer W, will hereinafter be referred to as the optical axis direction of the projection optical system PO. This optical axis direction will be defined as the Z-axis direction; the Y-axis direction being the lateral direction within the drawing surface of FIG. 1 in a plane perpendicular to the Z-axis direction; and the X-axis direction being a direction perpendicular to the drawing surface.

The exposure apparatus 10 projects through the projection optical system PO, an image of a part of the circuit pattern drawn on the reflection type reticle R serving as a mask onto a wafer W serving as a substrate, while relatively scanning the reticle R and the wafer W in a linear direction (Y-axis direction in this case) in respect to the projection optical system PO. The entire circuit pattern of the reticle R is thus transferred respectively onto a plurality of shot areas on the wafer W by the step-and-scan method.

The exposure apparatus 10 comprises a light source unit 12 for horizontally emitting EUV light EL along the Y direction, a deflection mirror M (part of an illumination optical system) for reflecting the EUV light EL from the light source unit 12 and bending its optical path to make the light incident on the pattern surface (lower surface in FIG. 1) of the reticle R at a predetermined incident angle θ (θ is about 50 mrad in this case), a reticle stage RST serving as a mask stage for holding the reticle R, the projection optical system PO made up of a reflection optical system which irradiates the EUV light EL reflected on the pattern surface of the reticle R in a direction perpendicular to the exposing surface of the wafer W, a wafer stage WST serving as a substrate stage for holding the wafer W, focus sensors (14a and 14b), and an alignment optical system ALG serving as a mark detection system.

Figure 2:
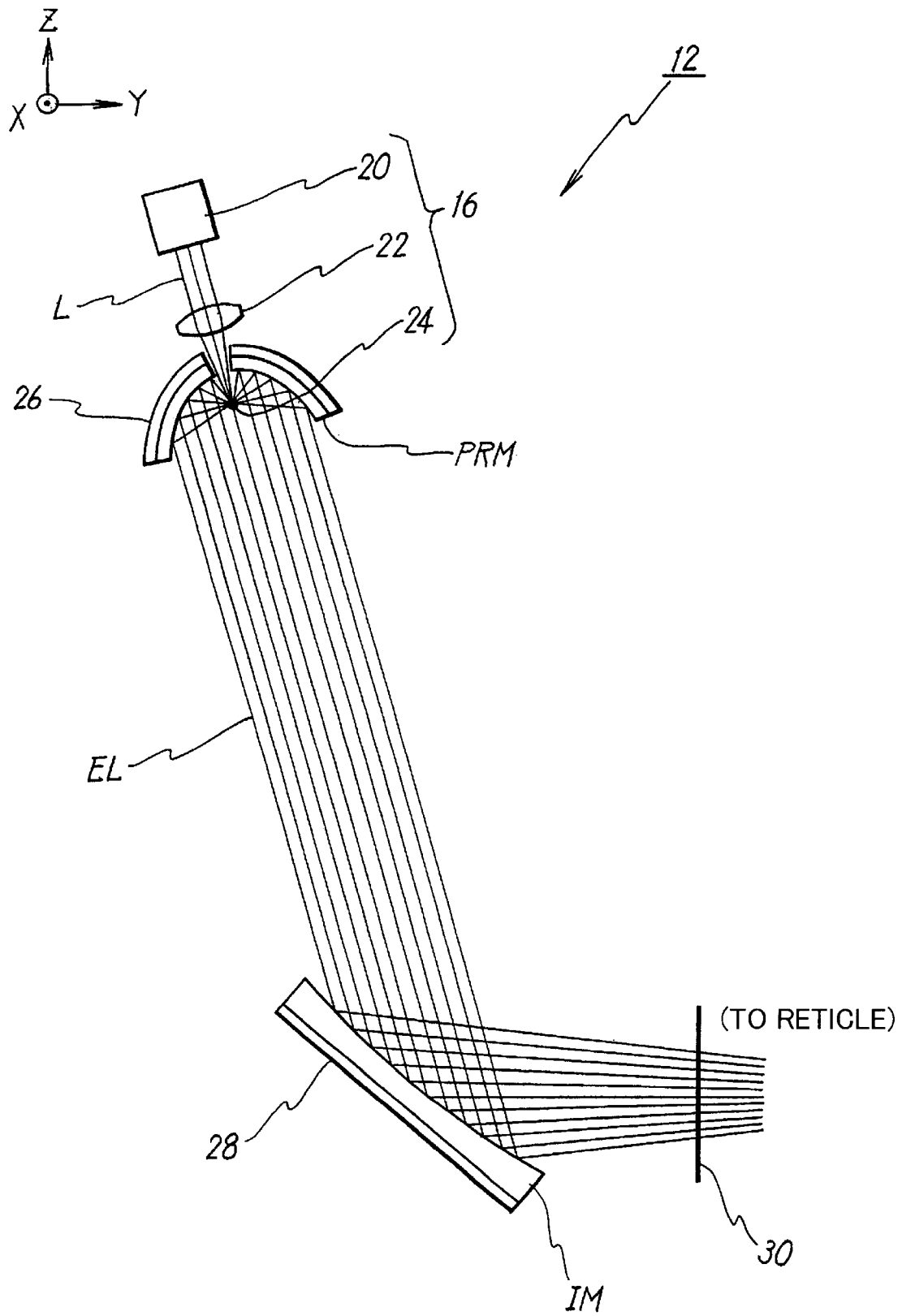
FIG. 2 illustrates the internal arrangement of a light source unit in FIG. 1.

As shown in FIG. 2, the light source unit 12 is formed from a laser plasma light source 16 and a part of the illumination optical system (PRM, IM, 30). The light source 16 comprises, for example, a high-power laser 20 such as a YAG laser which is a semiconductor excited laser or an excimer laser. It also comprises a condenser lens 22 for condensing a laser beam L from the high-power laser.20 to a predetermined condensing point, and an EUV light generating material 24 such as a copper tape arranged at the condensing point.

The mechanism for generating EUV light will be briefly described below. When the EUV light generating material 24 that is disposed at the condensing point of the condenser lens 22 is irradiated with the laser beam L from the high-power laser 20, the EUV light generating material 24 is heated to a high temperature by the energy of the laser beam. The heated EUV light generating material 24 becomes excited to a plasma state, thereby emitting the EUV light EL while transitioning to a low potential state.

Since the EUV light EL emitted in this manner diverges in all directions, a parabolic mirror PRM is disposed within the light source unit 12 to condense the light. The EUV light EL is condensed and collimated by this parabolic mirror PRM. An EUV light reflecting layer for reflecting EUV light is formed on the inner surface of the parabolic mirror PRM, and a cooling device 26 is attached to the rear surface of the parabolic mirror PRM. A unit using a cooling liquid is preferably used as the cooling device 26 (considering of the cooling efficiency of these types of units). The present invention, however, is not limited to this type of unit. The parabolic mirror PRM is preferably made of metal (considering the thermal conductivity of metals). It is known that, in the case where a multi-layer film formed by alternately depositing layers consisting of two different materials is used as the EUV light reflecting layer formed on the surface of the parabolic mirror PRM, only light having a specific wavelength is reflected. If, for example, several ten layers consisting of molybdenum (Mo) and silicon (Si) are coated, EUV light having a wavelength of about 13.4 nm is selectively reflected. With molybdenum and beryllium, EUV light having a wavelength of about 11.5 nm is reflected. Light having wavelengths that are not reflected are absorbed by the multilayer film and the like and converted into heat. As a consequence, the temperature of the parabolic mirror PRM rises. To cool the parabolic mirror PRM, the cooling device 26 is required. The EUV light collimated by the parabolic mirror PRM has a circular sectional shape perpendicular to the optical axis and is a collimated light of uniform intensity distribution.

The light source unit 12 further incorporates an illumination mirror IM for reflecting the collimated EUV light EL and deflecting it toward the deflection mirror M in FIG. 1. It also incorporates a wavelength selection window 30 made of beryllium or the like. The wavelength selection mirror is disposed downstream (to the right side on the drawing surface of FIG. 2) of the illumination mirror IM in the traveling direction of the EUV light EL. As shown in FIG. 2, the illumination mirror IM has a curved surface on the side where the EUV light EL is irradiated. On the curved surface, a reflecting layer made of a multilayer film in which two different materials selected in accordance with the wavelength of the EUV light EL (for example, several tens of molybdenum (Mo) and silicon (Si) layers) being alternately deposited in layers is formed. The illumination mirror IM is designed so that the EUV light reflected on this reflecting surface focuses in the form of a long slit when irradiated on the reticle R.

The vertical direction within the drawing surface of FIG. 2 corresponds to a direction perpendicular to the longitudinal direction of an arcuated illumination area having a predetermined area (an illumination area with a shape of a portion of the ring-shaped illumination area) which will be described later, upon illuminating the pattern surface of the reticle R, which will also be described later. The focal plane of the illuminating light coincides with the pattern surface of the reticle R. In this case, even though the pattern surface of the reticle R is said to coincide with the focal plane, the light source of the EUV light EL has a finite size. The EUV light EL, therefore, has a width of about 1 mm to 10 mm on the focal plane. Consequently, the EUV light EL is not too thin to illuminate the arcuated illumination area. A cooling device 28 identical to the cooling device 26 described above is arranged on the back surface side of the reflecting surface of the illumination mirror IM.

The wavelength selection window 30, in this case, is arranged for the purpose of cutting off visible light. The EUV reflecting film made of a multilayer film has a relatively significant wavelength selectivity near the wavelength of EUV light. The EUV reflecting film selectively reflects only light having a specific wavelength used for exposure. However, visible light, ultraviolet light, and the like are similarly reflected. In the case these light beams are guided to the reticle R or the projection optical system P0, the reticle R or the mirrors (to be described later) constituting the projection optical system P0 generate heat due to the extra energy. Furthermore, in the worst case, the unnecessary light transferred onto the wafer W may result in deterioration of the image quality. For these reasons, the wavelength selection window 30 is used to prevent such inconveniences from occurring.

Figure 3:
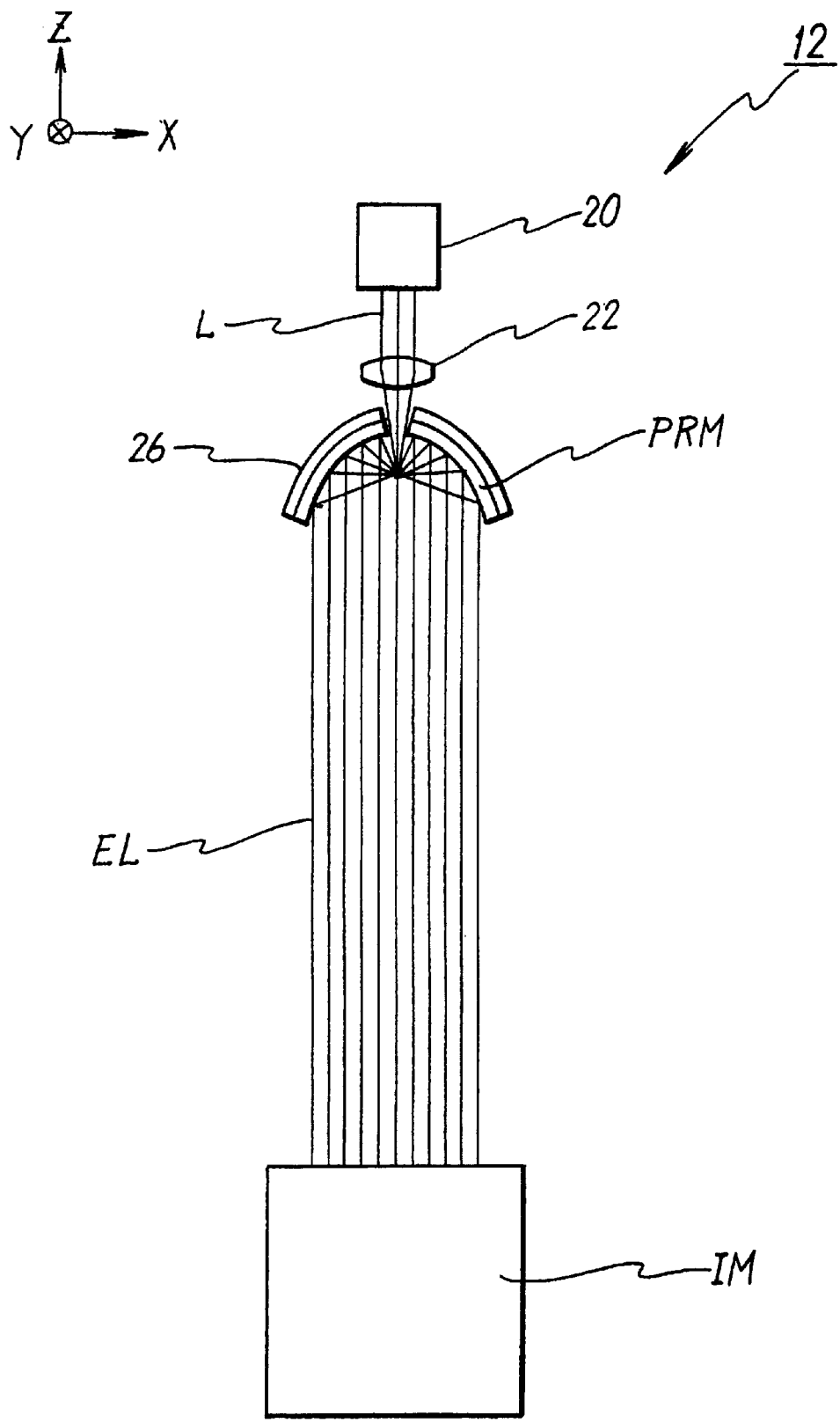
FIG. 3 is a left side view of the light source unit in FIG. 2.

FIG. 3 shows a one sided view in the Y direction (the left side of FIG. 2) of the light source unit 12 in FIG. 2. In FIG. 3, the deflection mirror M in FIG. 1 is located on the rear side of the drawing surface. Although the reflecting surface of the illumination mirror IM is not shown in FIG. 3, it has a rectangular shape when viewed from the rear side of the drawing surface of FIG. 3. That is, the reflecting surface of the illumination mirror IM is of a concave shape in FIG. 2 and of a rectangular shape in FIG. 3 which is a left side view of this reflecting surface. Accordingly, the reflecting surface has a similar shape as that of a portion of the cylindrical inner surface. In this case, the EUV light EL converges within the drawing surface of FIG. 2, but remains collimated within the drawing surface of FIG. 3, thus, the length in the lateral direction in FIG. 3 coincides with the length of the arcuated illumination area in the longitudinal direction. The light is said to be collimated, however, since the light source has a finite size. As described above, the spatial coherency is not equal to zero.

Figure 4:
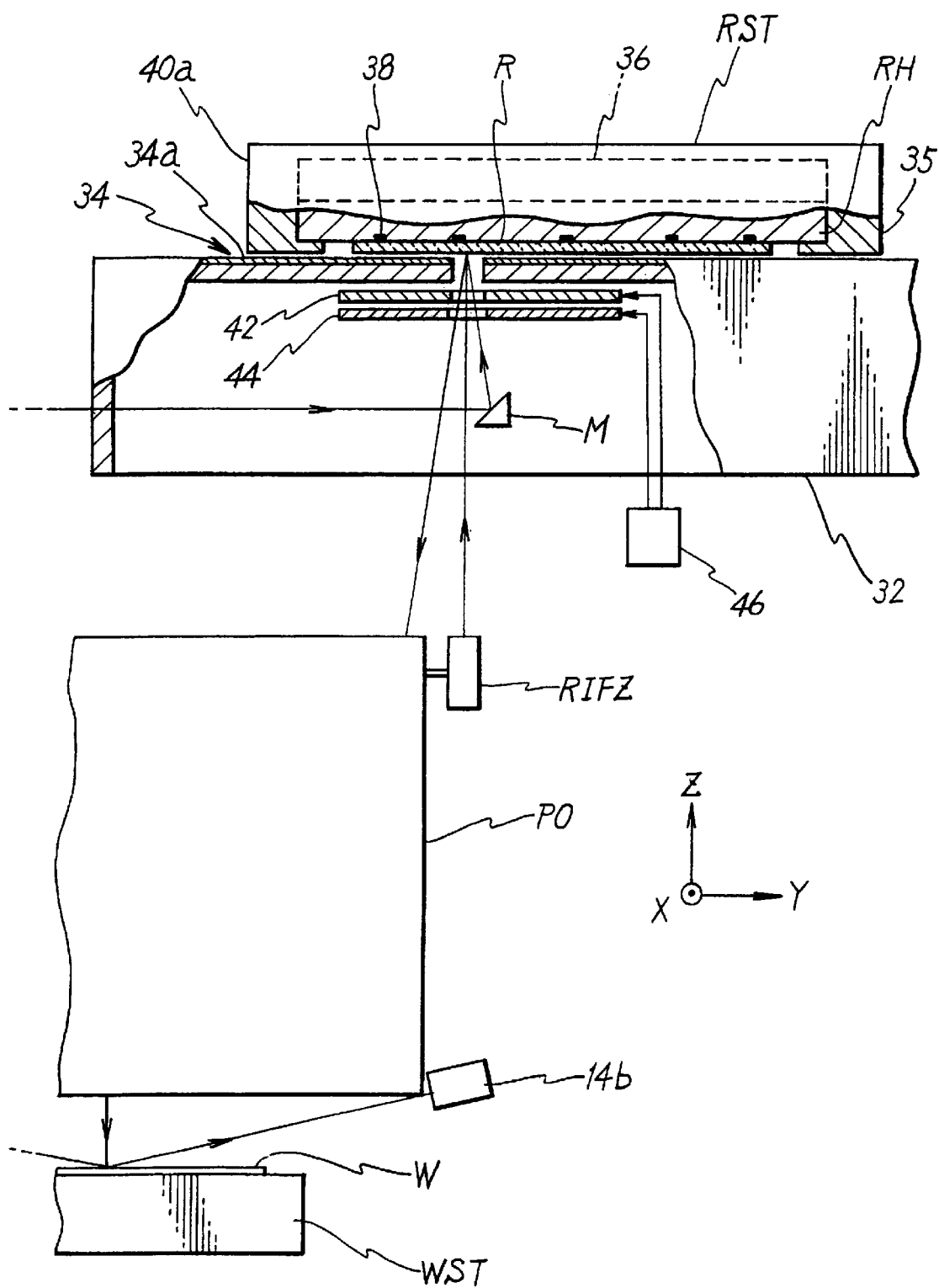
FIG. 4 is a view indicating the details of components near the reticle stage in FIG. 1.

The reticle stage RST, although not shown in FIG. 1, is actually arranged on a reticle stage base 32 arranged along the X-Y plane and supported by levitation above the reticle stage base 32 with a magnetic levitation two-dimensional linear actuator 34, as shown in FIG. 4. The reticle stage RST is driven in the Y direction with predetermined strokes by the magnetic levitation two-dimensional linear actuator 34, and is also finely driven in the X direction and the θ direction (rotational direction around the Z-axis). In addition, the reticle stage RST can be finely driven in the Z direction and a direction inclined to the X-Y plane by the magnetic levitation two-dimensional linear actuator 34.

A permanent magnet (not shown in FIGS.) is arranged on the bottom portion of a peripheral portion of the reticle stage RST. The magnetic levitation two-dimensional linear actuator 34 is formed from the permanent magnet and a coil 34a wound on the reticle stage base 32 in the X-Y two-dimensional directions. The position and posture of the reticle stage RST in the six-dimensional directions is controlled by controlling the current flowing in the coil 34a with the main controller 80.

The reticle stage RST, as shown in the enlarged view of FIG. 4, comprises a reticle holder RH for holding the reticle R at a position opposite to the reticle stage base 32. It also comprises a stage body 35 for holding a peripheral portion of the reticle holder RH, and within the stage body 35 a temperature control unit 36 is arranged on the rear surface side (upper surface side) of the reticle holder RH to control the temperature of the reticle holder RH. As the reticle holder RH, a reticle holder based on the electrostatic chucking method is used. This is due to the exposure illumination light being an EUV light EL. The exposure apparatus 10 of this embodiment, in practical use, is housed in a vacuum chamber (not shown in FIGS.). Therefore, a reticle holder based on the vacuum chucking scheme cannot be used. The reticle holder RH may be made of the same material as that used for a conventional DUV exposure apparatus, e.g., a low-expansion glass or a ceramic material.

On the reticle chucking surface of the reticle holder RH, a plurality of temperature sensors 38 are arranged at predetermined intervals. The temperature sensors 38 accurately measure the temperature of the reticle R, and the temperature control unit 36 controls the temperature based on the measured results to maintain the temperature of the reticle R at a predetermined target value. As a cooling device structuring the temperature control unit 36, a unit based on the liquid cooling method which introduces a cooling liquid through a flexible tube from the exterior can be employed. A unit based on a method of using an electronic element such as a Peltier element, and a unit based on a scheme of using a heat exchanger such as a heat pipe, or the like can also be used.

Figure 6:
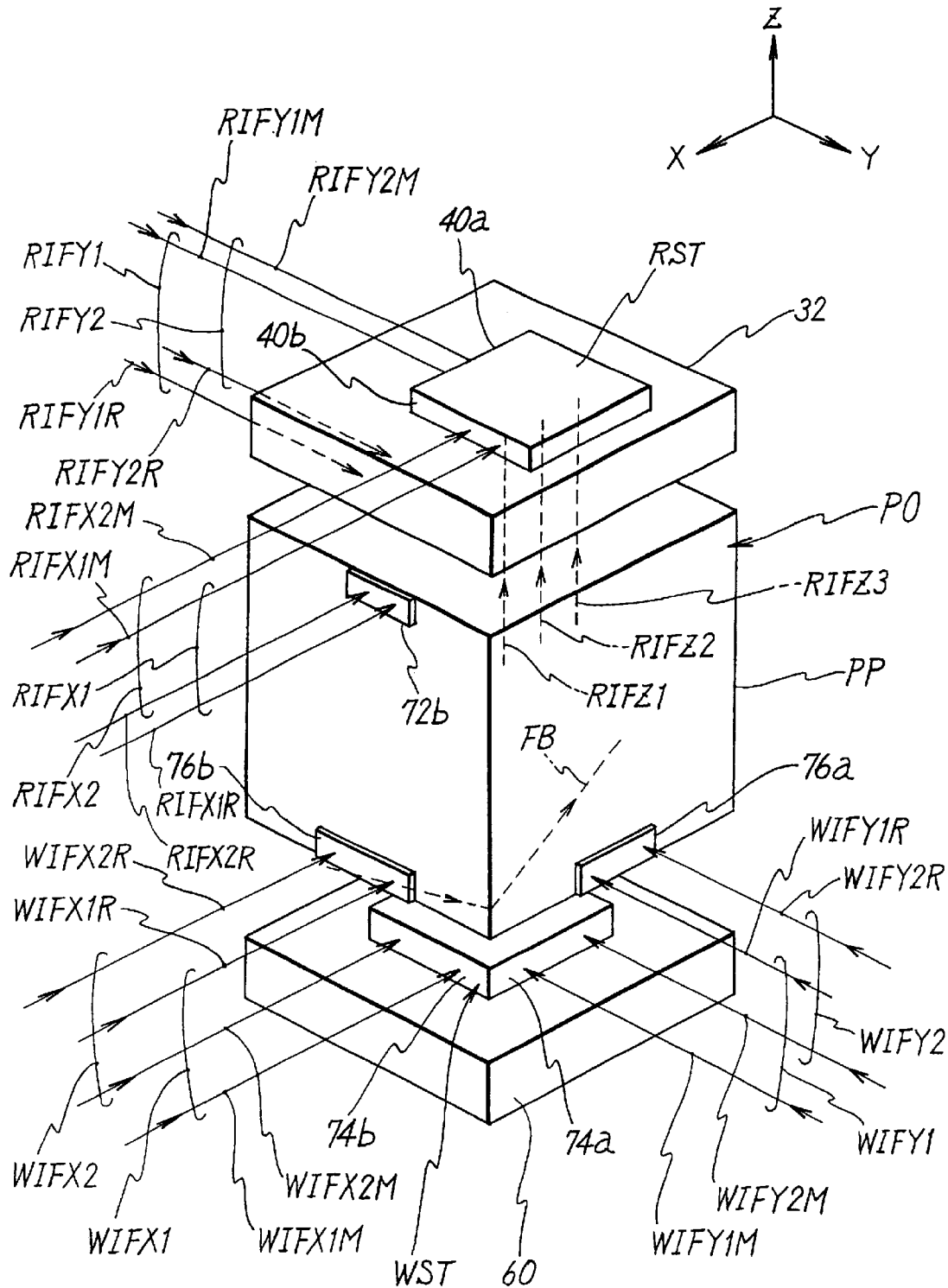
FIG. 6 is a view that illustrates the configuration of an interferometer system for measuring the positions of the reticle stage and wafer stage within the X-Y plane.

On one side surface of the reticle stage RST, in the Y direction, a reflecting surface 40a that is mirror-polished to reflect light of the visible range is formed. Although not shown in FIG. 4, one side surface of the reticle stage RST in the X direction is also mirror-polished to form a reflecting surface 40b for light in the visible range as is illustrated in FIG. 6. In the exposure apparatus 10, identical to the conventional exposure apparatus using the DUV light source, the position of the reticle stage RST within the X-Y plane is controlled by an interferometer system which irradiates the reflecting surfaces 40a and 40b with measurement beams. This interferometer system will be described later in detail.

On the surface (pattern surface) of the reticle R, a reflecting film for reflecting EUV light is formed. This reflecting film is a multilayer film formed by alternately depositing layers consisting of two different materials. In this case, a multilayer film made of molybdenum (Mo) and silicon (Si) is used to form a reflecting film having a reflectivity of about 70% with respect to EUV light having a wavelength of about 13 nm. This reflecting film is coated with a material that absorbs EUV light, and then patterning is performed. Once patterning is performed on a reflecting substance such as a multilayer film, the pattern cannot be recovered in the case of a failure. In contrast, the method of forming an absorbing layer (absorbing film) and patterning it allows recovery of the patterning. Since most materials that exist do not reflect EUV light, they can be used as the absorbing layer. In this embodiment, as will be described later, laser interferometers (RIFZ1 to RIFZ3) are used to measure the Z-direction position of the reticle R. Hence, with respect to measurement beams (in the visible range) from these laser interferometers, an absorbing layer whose reflectivity is almost equal to that of the reflecting layer (reflecting film) is formed. In addition, the criteria for selection of the material for this absorbing layer may include, e.g., ease of patterning, adherence to the reflecting layer, the degree of age deterioration due to oxidation, and the like.

Figure 5:
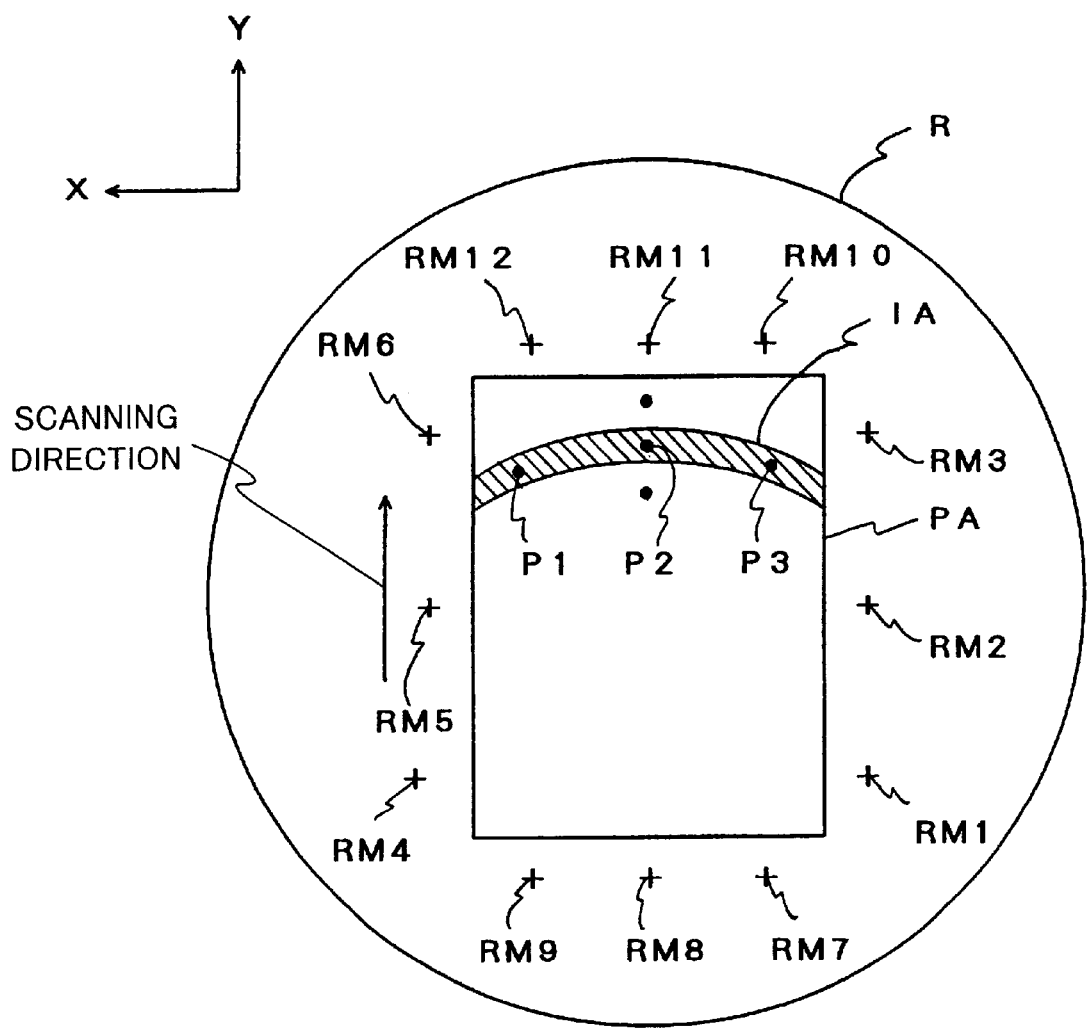
FIG. 5 is a schematic plan view of a reticle.

FIG. 5 shows an example of the reticle R. A rectangular area in the center of FIG. 5 is a pattern area PA. The arcuated region indicated by the hatching is an illumination area IA to be irradiated by the EUV light EL. In this case, exposure is performed by irradiating the arcuated illumination area so that the illumination is limited to an area in which the aberration of the projection optical system PO (to be described later) is a minimum. On the two end portions of the pattern area PA of the reticle R in the X direction, reticle alignment marks RM1 to RM6 are provided as positioning marks at predetermined intervals along the Y direction. The reticle alignment marks RM1 and RM4, RM2 and RM5, and RM3 and RM6 are arranged substantially along the X direction.

As is obvious from FIG. 5, when the arcuated illumination area IA is to be used, full exposure (static exposure) is not feasible, therefore, scanning exposure is performed in this embodiment, as will be described later.

Since the reticle R has the reflecting layer formed on its surface as described above, the material for the reticle R itself is not specifically limited. The reticle R may be made of the following material: low-expansion glass, silica glass (e.g., ZERODURE available from Shot or ULE available from Corning), a ceramic material, a silicon wafer, or the like. For example, a criterion for selection of the material for the reticle R may be the desire to use the same material as that of the reticle holder RH. In such a case, although the reticle R and reticle holder RH undergo thermal expansion due to a temperature rise caused by irradiation with the exposure illumination light EL or the like, since the two components are made of the same material, the expansion amount is the same. Therefore, the two components are unaffected by divergence forces (thermal stress). In case different materials are used for the reticle R and reticle holder RH, the same effect as described above can be obtained as long as the materials have the same linear expansivity. For example, a silicon wafer may be used for the reticle R, and SiC (silicon carbide) may be used for the reticle holder RH. When the silicon wafer is used as a material for the reticle R process apparatus such as a pattern drawing apparatus, a resist coating apparatus, and an etching apparatus can be used without any modifications. In this embodiment, for the reason above, the silicon wafer is used as a material for the reticle R, and the reticle holder is made of SiC.

Referring back to FIG. 1, a movable blind 42 and a slit plate 44 serving as a field stop are arranged below the reticle R (on the EUV light incident side) adjacent to the reticle R. More specifically, in practice, the movable blind 42 and slit plate 44 are arranged in the reticle stage base 32, as shown in FIG. 4.

Figure 7:
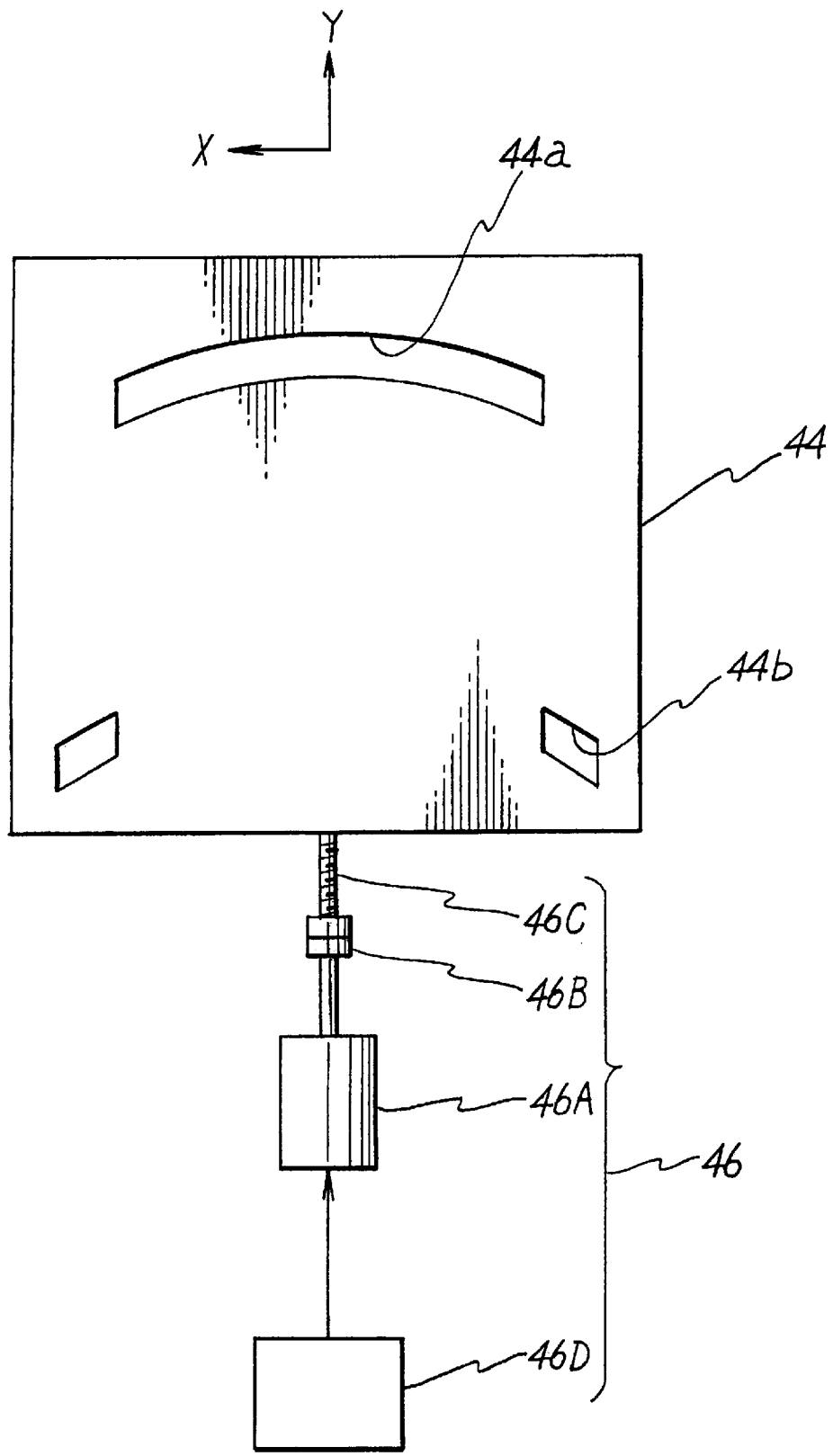
FIG. 7 is a plan view showing an example of the slit plate and its driving mechanism in FIG. 1.

The slit plate 44 determines the arcuated illumination area IA, and can be fixed to the projection optical system PO. In this embodiment, however, the slit plate 44 is driven by a driving mechanism 46 serving as a switching mechanism including a motor and the like. FIG. 7 is a plan view illustrating the slit plate 44 and the driving mechanism 46. The slit plate 44 has a first slit 44a for determining the arcuated illumination area (first illumination area) IA on the reticle R which is irradiated with the EUV light EL as exposure illumination light. It also has a second slit 44b for determining a second illumination area where portions corresponding to the alignment marks RM1 and RM4 (RM2 and RM5 or RM5 and RM3) provided on the two sides of the pattern area PA of the reticle R, are irradiated with the exposure illumination light EL. The driving mechanism 46 comprises a motor 46A, a feed screw 46C coupled to the output shaft of the motor via a coupling 46B, and a control unit 46D for the motor 46A. The feed screw 46C is screwed together with a nut portion (not shown) projecting vertically from the slit plate 44 on the rear side of the drawing surface of FIG. 7. The feed screw 46C is rotably driven by the rotation of the motor 46A, and as a consequence, the slit plate 44 is driven in the axial direction (Y direction) of the feed screw 46C. The control unit 46D of the driving mechanism 46 switches the slit plate 44 in accordance with instructions from the main controller 80 which is to be described later (see FIG. 10). Based on the instructions, the slit plate 44 is set to the first position so that the first slit 44a is irradiated with the exposure illumination light EL upon exposure. And when positioning (alignment) of the reticle R is performed, the slit plate 44 is set to the second position where the second slit 44b is irradiated with the exposure illumination light EL. Alternatively, the slit plate 44 may be driven by, for example, a linear motor instead of the feed screw mechanism.

Referring back to FIG. 4, the movable blind 42 is arranged to prevent a redundant circuit pattern drawn on the same reticle R from being included in the illumination area IA and transferred onto the wafer W. In this embodiment, in accordance with instructions from the main controller 80 (see FIG. 10), the control unit 46D of the driving mechanism 46 controls the movement of the movable blind 42 in the Y direction synchronously with the movement of the reticle stage RST in the Y direction. In this case, the movement of the movable blind 42 may be identical to that of the reticle R, starting after the scanning of the reticle R has started or before the scanning of the reticle. In the latter case, acceleration can be suppressed. Alternatively, the movable blind 42 may start moving as the target pattern to be hidden starts crossing the illumination area.

Referring back to FIG. 1, as described above, as the projection optical system PO, the reflection optical system structured of only reflection optical elements (mirrors) is employed, and a system having a projection magnification of ¼ is used. Accordingly, the EUV light EL that is reflected by the reticle R and contains the pattern information formed on the reticle R, is reduced to ¼ by the projection optical system PO and irradiated onto the wafer W.

Figure 8:
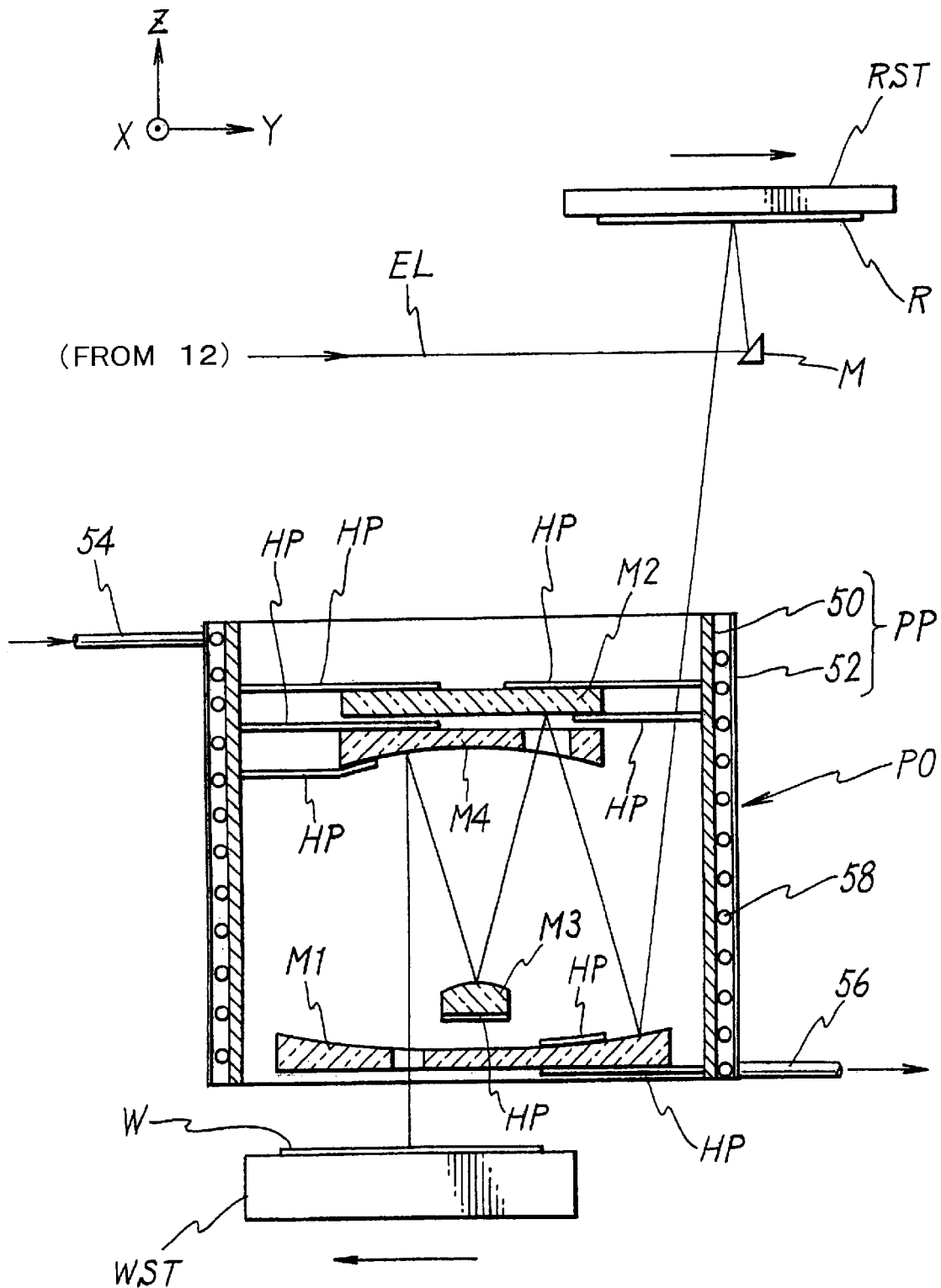
FIG. 8 is a schematic view illustrating the internal arrangement of the projection optical system in FIG. 1.

The projection optical system PO will be described in more detail in reference to FIG. 8. As shown in FIG. 8, the projection optical system PO includes a total of four mirrors (reflection optical elements) for sequentially reflecting the EUV light EL reflected by the reticle R, i.e., a first mirror M1, second mirror M2, third mirror M3, and fourth mirror M4, and a lens barrel PP to hold these mirrors M1 to M4. The first and fourth mirror M1 and M4 have aspherical reflecting surfaces, the second mirror M2 has a plane reflecting surface and the third mirror M3 has a spherical reflecting surface. Each reflecting surface is formed with a finishing accuracy of no more than 1/50 to 1/60 of an exposure wavelength with respect to the designed value, with only a slight error being no more than 0.2 nm to 0.3 nm in terms of the RMS value (standard deviation). Each mirror is made of low-expansion glass or a metal, and like the reticle R, a reflecting layer for EUV light is formed on the surface of each mirror by using a multilayer film obtained by alternately depositing layers formed of two different materials.

In this case, as shown in FIG. 8, a hole is formed in the fourth mirror M4 allowing the light reflected by the first mirror M1 to reach the second mirror M2. Likewise, a hole is formed in the first mirror M1 to allow light reflected by the fourth mirror M4 to reach the wafer W. Obviously, each mirror may be shaped to have a notched portion (instead of a hole) through which a light beam can pass.

Since the projection optical system PO is arranged in a vacuum environment, the heat generated by irradiation of exposure illumination light cannot be released. In this embodiment, therefore, the mirrors M1 to M4 held by the lens barrel PP are connected via the heat pipe HP, and a cooling device is arranged to cool the lens barrel PP. More specifically, the lens barrel PP has a double-layer structure formed by a mirror holding portion 50 formed on the inner side, and a cooling jacket 52 mounted on the outer circumferential portion of the mirror holding portion 50. Arranged in the cooling jacket 52, cooling liquid flows from an inlet helical pipe 58 through a tube 54 to an outlet tube 56. In this case, cooling water is used as the cooling liquid. The cooling water circulates, flowing out from the cooling jacket 52 via the outlet tube 56, and exchanges heat with the refrigerant in a refrigerating device (not shown in Figs.). There, it is cooled off to a predetermined temperature. The cooling water then flows into the cooling jacket 52 via the inlet tube 54.

With the projection optical system PO of this embodiment, therefore, even if thermal energy is applied to the mirrors M1, M2, M3, and M4 due to irradiation of the exposure illumination light(EUV light) EL, the mirrors M1, M2, M3, and M4 are maintained at a predetermined temperature by the heat exchange with the lens barrel PP which is adjusted to the predetermined temperature by the heat pipe HP. In such a case, according to this embodiment, as shown in FIG. 8, the heat pipe HP is bonded to the surface sides (reflecting surface sides) of the mirrors M1, M2, M4, and the like, where the exposure illumination light does not irradiate, as well as their rear surface sides. This allows the respective mirrors to be effectively cooled, in comparison with the situation when only the rear surface sides are cooled. The heat pipe HP on the rear surface side of the third mirror M3 and the surface side of the first mirrorM1 reach the inner surface of the lens barrel PP in the direction of depth of the drawing surface. The exterior of the lens barrel PP is in the shape of a quadrilateral prism, as shown in FIG. 6.

Referring back to FIG. 1, the wafer stage WST is placed on a wafer stage base 60 arranged along the X-Y plane, and is supported by levitation above the wafer stage base 60 by a magnetic levitation two-dimensional linear actuator 62. This wafer stage WST is driven by the magnetic levitation two-dimensional linear actuator 62 with predetermined strokes in the X and Y directions, and is also finely driven in the θ direction (rotational direction around the Z axis). In addition, the wafer stage WST is structured so that it may be finely driven in the Z direction and a direction inclined to the X-Y plane by the magnetic levitation two-dimensional linear actuator 62.

On the bottom surface of the wafer stage WST, a permanent magnet (not shown in Figs.) is arranged. The magnetic levitation two-dimensional linear actuator 62 is configured by this permanent magnet and a coil (not shown in Figs.) wounded on the wafer stage base 60 in the X and Y, two-dimensional directions. The position and posture of the wafer stage WST in the six-dimensional directions is controlled by controlling the current flowing in the coil with the main controller 80 (to be described later).

A wafer holder (not shown in Figs.) is mounted on the upper surface of the wafer stage WST by electrostatic chucking, holding the wafer W chucking. Furthermore, on the other side in the Y direction in FIG. 1A, the side surface of the wafer stage WST is mirror-polished to form a reflecting surface 74a for light in the visible range. Omitted in FIG. 1, on one side in the X direction, a side surface of the wafer stage WST is also mirror-polished to form a reflecting surface 74b for light in the visible range as in FIG. 6. With the exposure apparatus 10, the positions of the reflecting surfaces 74a and 74b relative to the projection optical system PO are accurately measured by an interferometer system which irradiates the reflecting surfaces 74a and 74b with measurement beams. This interferometer system will be described later.

On one end portion of the upper surface of the wafer stage WST, an aerial image sensor FM (see FIG. 1) is arranged. This aerial image sensor FM serves as a position detection system when measuring, for example, the positional relationship between the projecting position of the pattern drawn on the reticle R on the wafer W and the position of the alignment optical system ALG (a so-called "baseline measurement"). The aerial image sensor FM corresponds to a reference mark plate in a conventional DUV exposure apparatus.

Figure 9A:
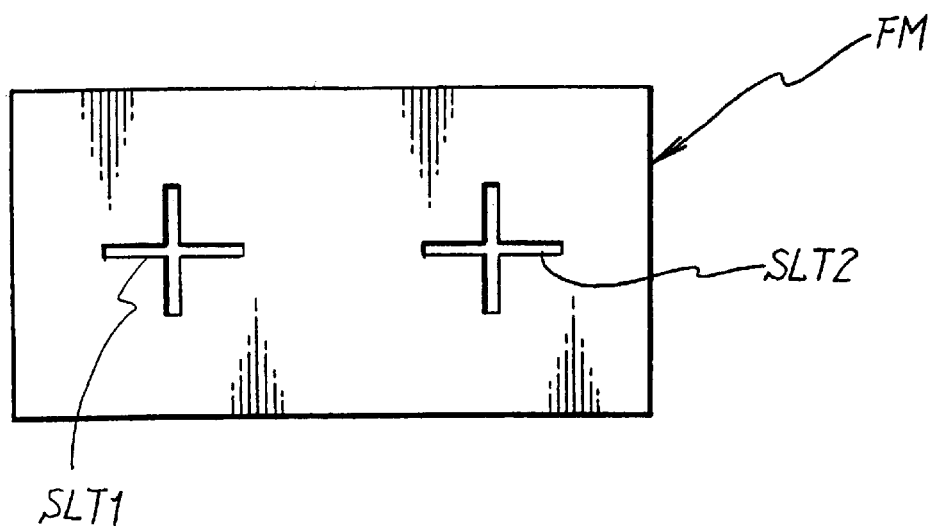
FIG. 9A is a plan view showing an aerial image sensor.
Figure 9B:
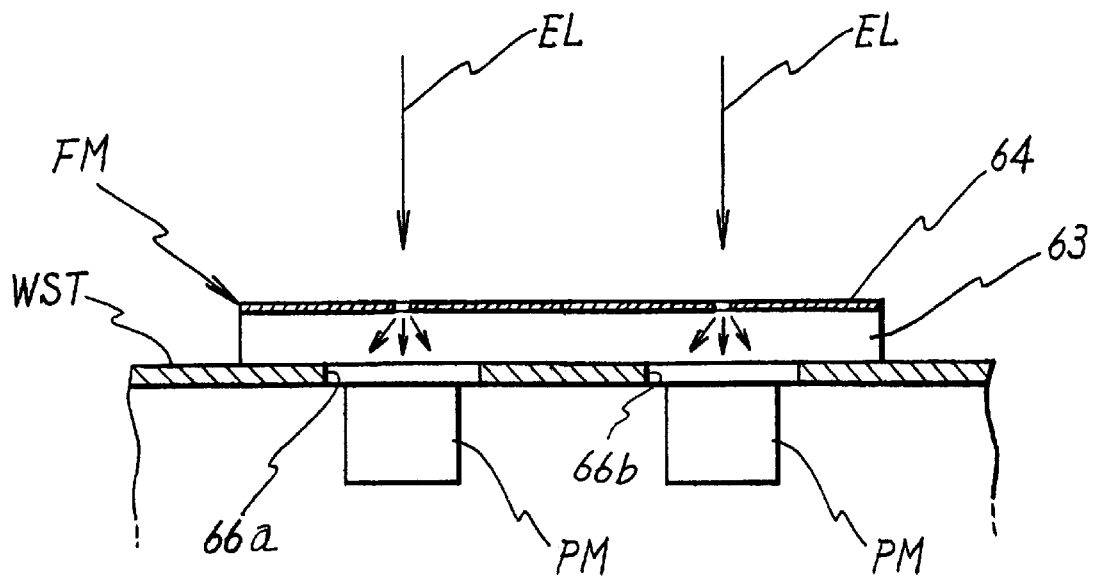
FIG. 9B is a side view of the aerial image sensor.

FIGS. 9(A) and 9(B) are, respectively, a plan view and longitudinal sectional view of the aerial image sensor FM. As shown in these drawings, on the upper surface of the aerial image sensor FM, slits SLT1 and SLT2 are formed as openings. These slits SLT1 and SLT2 are formed by patterning an EUV light reflecting layer 64 formed on the surface of a fluorescent material 63 fixed on the upper surface of the wafer stage WST and having a predetermined thickness. Alternatively, an EUV light absorbing layer may be formed instead of the reflecting layer 64, and openings may be formed on the absorbing layer.

Below the slits SLT1 and SLT2, openings 66a and 66b are formed on the top surface plate of the wafer stage WST. In the interior of the wafer stage WST, arranged opposing the openings 66a and 66b, photoelectric conversion devices PM such as photomultipliers are respectively arranged. Accordingly, the EUV light EL irradiated on the aerial image sensor FM from above via the projection optical system PO transmits through the slits SLT1 and SLT2 and reaches the fluorescent material 63. This causes the fluorescent material 63 to emit light having a wavelength longer than the EUV light. This light is received by the photoelectric conversion devices PM, and is converted into electrical signals corresponding to the intensity of the light. The output signals from the photoelectric conversion devices PM are also supplied to the main controller 80. The positional relationship of the slits SLT1 and SLT2 almost corresponds to the positional relationship of the reticle alignment marks RM1 and RM4 (RM2 and RM5 or RM3 and RM6) arranged on the reticle R along the X direction. In reticle alignment (to be described later), the reticle alignment marks RM1 and RM4 can be simultaneously measured through the slits SLT1 and SLT2.

Next, the configuration of an interferometer system 70 (see FIG. 10) for measuring the positions of the reticle stage RST and wafer stage WST will be described in detail, in reference to FIG. 6. FIG. 6 representatively shows the corresponding laser interferometer by using the measurement axis of each laser interferometer.

The interferometer system 70 comprises four laser interferometers RIFX1, RIFX2, RIFY1, and RIFY2 for measuring the position of the reticle stage RST within the X-Y plane, and four laser interferometers WIFX1, WIFX2, WIFY1, and WIFY2 for measuring the position of the wafer stage WST within the X-Y plane.

The interferometer RIFY1 projects a measurement beam RIFY1M on the reflecting surface 40a of the reticle stage RST, and also projects a reference beam RIFY1R on a fixed mirror (reference mirror) 72a (see FIG. 1) attached to the lens barrel PP of the projection optical system PO. The interferometer RIFY1 then receives the respective reflected light beams to measure the relative position of the reticle stage RST in the Y direction with respect to the fixed mirror 72a at the projection position of the measurement beam RIFY1M.

Similarly, the interferometer RIFY2 projects a measurement beam RIFY2M on the reflecting surface 40a of the reticle stage RST, and also projects a reference beam RIFY2R on the fixed mirror (reference mirror) 72a (see FIG. 1) attached to the lens barrel PP of the projection optical system PO. The interferometer RIFY2 then receives the respective reflected beams to measure the relative position of the reticle stage RST in the Y direction with respect to the fixed mirror 72a at the projection position of the measurement beam RIFY2M.

The center of the irradiation positions of the two measurement beams RIFY1M and RIFY2M of the two interferometers RIFY1 and RIFY2 coincides with the center of the illumination area IA (the center of the reticle R in the X direction). Therefore, the average of the measurement values obtained by these two interferometers provides the Y-direction position of the reticle stage RST. The value obtained by dividing the difference of the two measurement values by the distance between the interferometer axes provides the rotational angle (denoted by $\alpha 1$ in this case) of the reticle stage RST. The measurement values obtained by these interferometers RIFY1 and RIFY2 are sent to the main controller 80, and the main controller 80 calculates the average and rotational angle $\alpha 1$ as described above.

Also, the interferometer RIFX1 projects a measurement beam RIFX1M on the reflecting surface 40b of the reticle stage RST, and also projects a reference beam RIFX1R on a fixed mirror (reference mirror) 72b attached to the lens barrel PP of the projection optical system PO. The interferometer RIFX1 then receives the respective reflected light beams to measure the relative position of the reticle stage RST in the X direction with respect to the fixed mirror 72b at the projection position of the measurement beam RIFX1M.

Similarly, the interferometer RIFX2 projects a measurement beam RIFX2M on the reflecting surface 40b of the reticle stage RST, and also projects a reference beam RIFX2R on the fixed mirror (reference mirror) 72b attached to the lens barrel PP of the projection optical system PO. The interferometer RIFX2 then receives the respective reflected beams to measure the relative position of the reticle stage RST in the X direction with respect to the fixed mirror 72b at the projection position of the measurement beam RIFX2M.

The center of the irradiation positions of the two measurement beams RIFX1M and RIFX2M from the two interferometers RIFX1 and RIFX2 coincides with the center of the illumination area IA (see a point P2 in FIG. 5). Therefore, the average of the measurement values obtained by these two interferometers provides the X-direction position of the reticle stage RST. The value obtained by dividing the difference of the two measurement values by the distance between the interferometer axes provides the rotational angle (denoted by $\alpha 2$ in this case) of the reticle stage RST. The measurement values obtained by these interferometers RIFX1 and RIFX2 are sent to the main controller 80, and the main controller 80 calculates the average and rotational angle $\alpha 2$ as described above. In this case, the main controller 80 calculates one of the rotational angles $\alpha 1$ and $\alpha 2$ or an average value $(\alpha 1 + \alpha 2)/2$, as the rotational angle of the reticle stage RST in the $\theta$ direction.

The interferometer WIFY1 projects a measurement beam WIFY1M on the reflecting surface 74a of the wafer stage WST, and also projects a reference beam WIFY1R on a fixed mirror (reference mirror) 76a attached to the lens barrel PP of the projection optical system PO. The interferometer WIFY1 receives the respective reflected beams to measure the relative position of the wafer stage WST in the Y direction with respect to the fixed mirror 76a at the projection position of the measurement beam WIFY1M.

Similarly, the interferometer WIFY2 projects a measurement beam WIFY2M on the reflecting surface 74a of the wafer stage WST, and also projects a reference beam WIFY2R on the fixed mirror (reference mirror) 76a attached to the lens barrel PP of the projection optical system PO. The interferometer WIFY2 receives the respective reflected beams to measure the relative position of the wafer stage WST in the Y direction with respect to the fixed mirror 76a at the projection position of the measurement beam WIFY2M.

The center of the irradiation positions of the two measurement beams WIFY1M and WIFY2M of the two interferometers WIFY1 and WIFY2 coincides with the center of an arcuated exposure area SA (see FIG. 11) on the wafer which corresponds to the illumination area IA. Therefore, the average of the measurement values obtained by these two interferometers provides the Y-direction position of the wafer stage WST. The value obtained by dividing the difference of the two measurement values by the distance between the interferometer axes provides the rotational angle (denoted by $\beta 1$ in this case) of the wafer stage WST. The measurement values obtained by these interferometers WIFY1 and WIFY2 are sent to the main controller 80, and the main controller 80 calculates the above average and rotational angle $\beta 1$.

The interferometer WIFX1 projects a measurement beam WIFX1M on the reflecting surface 74b of the wafer stage WST, and also projects a reference beam WIFX1R on a fixed mirror (reference mirror) 76b attached to the lens barrel PP of the projection optical system PO. The interferometer WIFX1 then receives the respective reflected light beams to measure the relative position of the wafer stage WST in the X direction with respect to the fixed mirror 76b at the projection position of the measurement beam WIFX1M.

Similarly, the interferometer WIFX2 projects a measurement beam WIFX2M on the reflecting surface 74b of the wafer stage WST, and also projects a reference beam WIFX2R on the fixed mirror (reference mirror) 76*b* attached to the lens barrel PP of the projection optical system PO. The interferometer WIFX2 then receives the respective reflected beams to measure the relative position of the wafer stage WST in the X direction with respect to the fixed mirror 76*b* at the projection position of the measurement beam WIFX2M.

The center of the irradiation positions of the two measurement beams WIFX1M and WIFX2M of the two interferometers WIFX1 and WIFX2 coincides with the center of the exposure area SA which corresponds to the illumination area IA. Therefore, the average of the measurement values obtained by these two interferometers provides the X-direction position of the wafer stage WST. The value obtained by dividing the difference of the two measurement values by the distance between the interferometer axes provides the rotational angle (denoted by $\beta 2$ in this case) of the wafer stage WST. The measurement values obtained by these interferometers WIFX1 and WIFX2 are sent to the main controller 80, and the main controller 80 calculates the average and rotational angle $\beta 2$. The main controller 80 calculates one of the rotational angles $\beta 1$ and $\beta 2$ or an average value $(\beta 1+\beta 2)/2$, as the rotational angle of the wafer stage WST in the $\theta$ direction.

This embodiment, although not shown in Figs., further includes pitching interferometers and rolling interferometers for measuring pitching and rolling of the reticle stage RST and wafer stage WST. The main controller 80 calculates the pitching and rolling of the wafer stage WST and reticle stage RST based on the measurement values obtained by these interferometers.

Referring back to FIG. 1, on the lens barrel PP of the projection optical system PO, which measurement of all the eight interferometers described above is based on, a reticle surface measurement laser interferometer RIFZ is arranged to measure the Z-direction position of the reticle R. In practice, as is shown in FIG. 6, three laser interferometers RIFZ1, RIFZ2, and RIFZ3 are arranged at predetermined intervals and fixed to the lens barrel PP, however, as in FIG. 1 (and FIG. 4), these interferometers are represented as the laser interferometer RIFZ.

Measurement beams from these laser interferometers RIFZ1 to RIFZ3 are projected via an optical path in the Z direction onto the pattern surface of the reticle R (see FIGS. 1 and 4 for reference). The beams pass through three different points of the irradiation area of the exposure illumination light EL, i.e., the arcuated illumination area IA, respectively the center of the incident optical path and exit optical path (reflection optical path) of the exposure illumination light EL. The illumination light EL is irradiated via the deflection mirror M at a predetermined incident angle $\theta$. Thus, the beams of the laser interferometers RIFZ1, RIFZ2 and RIFZ3 do not affect the illumination light EL entering the pattern surface of the reticle at a predetermined incident angle $\theta$ and having the same outgoing angle as of the incident angle, nor are interfered by the illumination light EL. And, a highly precise measurement of the Z-direction position of the reticle R, e.g., a precision of no more than several nm to 1 nm) becomes possible.

As for the laser interferometers RIFZ1, RIFZ2 and RIFZ3, a type of interferometer with a built-in reference mirror (not shown in Figs.) is used. The position of the reference mirror is used as a reference to respectively measure the Z-direction position of the irradiation position of a measurement beam on the reticle R. In this case, the laser interferometer RIFZ1 projects a measurement beam in the illumination area IA in FIG. 5 at the position of a point P1. The laser interferometer RIFZ2 projects a measurement beam at the position of a point P2, and the laser interferometer RIFZ3 projects a measurement beam at the position of a point P3. The point P2 is located at the center of the illumination area IA, i.e., a point that is located on the central axis of the pattern area PA in the X direction and on the central point of the illumination area IA in the Y direction. The points P1 and P3 are located at positions symmetrical to the central axis.

Figure 10:
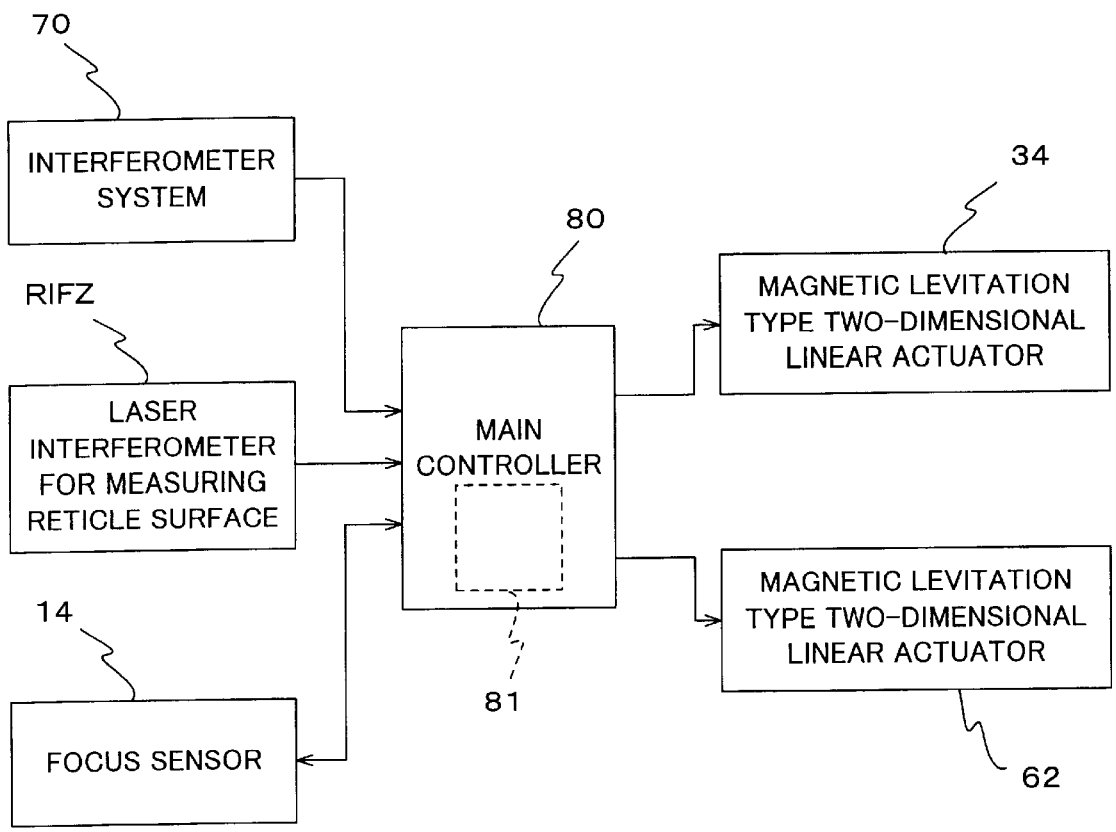
FIG. 10 is a block diagram schematically showing the configuration of a control system related to the position and posture control of the wafer (wafer stage) and reticle (reticle stage)

The measurement values obtained by these three laser interferometers RIFZ1 to RIFZ3 are input to the main controller 80 (see FIG. 10). The main controller 80 corrects the Z position and tilt (pitching and rolling) of the reticle stage RST, i.e., the reticle R, through the magnetic levitation type two-dimensional linear actuator 34 based on these measurement values, as will be described later.

As described above, this embodiment includes the pitching and rolling interferometers for measuring the pitching and rolling of the reticle stage RST in addition to the laser interferometers RIFZ for reticle surface measurement. In order to control the pitching and rolling of the reticle R (reticle stage RST) more accurately, the main controller 80 may correct errors (which are negligible) due to the unevenness of the reticle pattern surface based on the measurement values obtained by both of the laser interferometers RIFZ1 to RIFZ3 and the pitching and rolling interferometers.

The Z-direction position of the wafer W with reference to the lens barrel PP is measured by a focus sensor 14 based on an oblique incident light method, fixed to the projection optical system PO. As shown in FIG. 1, this focus sensor 14 is made up of a light-transmittance element 14*a* fixed to a column (not shown in Figs.) which supports the lens barrel PP and obliquely irradiates a detection beam FB onto the surface of the wafer W, and a light-receiving element 14*b* also fixed to the column (not shown in FIGS.) and receiving the detection beam FB reflected by the surface of the wafer W. As this focus sensor, for example, the multi-point focal position detection system disclosed in Japan Patent Laid Open No.06-283403 and U.S. Pat. No. 5,448,332 corresponding thereto are used, and the above cited disclosures being fully incorporated herein by reference. It is essential to integrally fix this focus sensor 14 (14*a*, 14*b*) to the lens barrel PP.

As is obvious from the description above, in this embodiment, the positions of the reticle R in the three-dimensional directions, i.e., the X, Y, and Z directions, are measured in reference to the lens barrel PP of the projection optical system PO. In addition, the positions of the wafer W in the three-dimensional directions, i.e., the X, Y, and Z directions, are measured in reference to the lens barrel PP of the projection optical system PO. For this reason, the same support member does not have to support the projection optical system PO, the reticle stage RST, and the wafer stage WST, and they may be respectively supported by different members. That is, the projection optical system PO, reticle stage RST, and wafer stage WST do not require mechanical contact with each other at all. The main bodies of the respective interferometers structuring the interferometer system 70, as described above, also measure in reference to the fixed mirrors respectively attached to the lens barrel PP. The interferometers, therefore, do not require mechanical contact with the projection optical system PO, the reticle stage RST, and the wafer stage WST.

Furthermore, in this embodiment, the alignment optical system ALG is fixed to a side surface of the projection optical system PO, as shown in FIG. 1. As this alignment optical system ALG, various types of devices can be used. These include an image forming alignment sensor for irradiating an alignment mark (or aerial image sensor FM) on the wafer W with broadband light and receiving the reflected light so as to perform mark detection by an image processing method, an LIA (Laser Interferometer Alignment) sensor for irradiating a lattice mark with a laser beam and detecting diffracted light, and a scanning probe microscope such as an AFM (Atomic Force Microscope). In this case, an image forming alignment sensor incorporating a focus detection system based on an image processing method is used as the alignment optical system ALG. Such an image forming alignment sensor incorporating a focus detection system is disclosed in, for example, Japan Patent Laid Open No.07-321030 and U.S. Pat. No. 5,721,605 corresponding thereto. The above disclosures are fully incorporated herein by reference.

FIG. 10 is a block diagram schematically showing the configuration of a control system related to position and posture control on the wafer W (wafer stage WST) and the reticle R (reticle stage WST) as described earlier. In the control system shown in FIG. 10, the main controller 80 is made from a microcomputer (or workstation) which incorporates a memory (RAM) 81 that serves as a storage unit. In this embodiment, the main controller 80 and magnetic levitation type two-dimensional linear actuators 34 and 62 form a driving unit.

Next, the exposure operation of the exposure apparatus 10 according to the first embodiment, having the structure above, will be described. The layers to be exposed, in this case, are the second layer and higher.

First, the reticle transfer system (not shown in Figs.) transfers the reticle R, and the reticle holder RH holds the reticle by suction on the reticle stage RST which is at the loading position. Furthermore, a wafer transfer system (not shown in Figs.) mounts the wafer W on the wafer stage WST by a wafer loading/unloading mechanism (not shown in Figs.). When these preparations are completed, the sequence shown in the flow chart of FIG. 12 starts.

Step 100

First, the main controller 80 detects the position of a wafer alignment mark (one or a plurality of marks for one shot) which is predetermined on the sample target. The wafer alignment marks are arranged in each shot region of the wafer W on the wafer stage WST by using the alignment optical system ALG while sequentially moving the wafer stage WST. During this mark position detection, the main controller 80 translates the Z position of the surface of the wafer W to the focal position of the alignment optical system ALG. Upon completing the detection of the positions of the wafer alignment marks of the sample shots, the main controller 80 calculates the array coordinates of all the shot regions on the wafer W. This is performed by a statistical technique using the least square method which is disclosed in, e.g., Japan Patent Laid Open No. 61-44429 and U.S. Pat. No. 4,780,617 corresponding thereto, using these data (this alignment method will be referred to as "EGA (Enhanced Global Alignment)" hereinafter). Alternatively, by using the position detection data as described above of a plurality of wafer alignment marks in a shot area, the main controller 80 can calculate the array coordinates in all shot areas, and the deformation amounts, including the magnification of each shot area on the wafer W, by a statistical technique using the least square method, which is disclosed in, e.g., Japan Patent Laid Open No.06-275496 and U.S. patent application Ser. No. 569,400 (application date: Dec. 8, 1995) corresponding thereto, (this alignment method will be referred to as "in-shot multiple point EGA" hereinafter). The above disclosures are fully incorporated herein by reference.

Step 102

When alignment measurement is completed as described above, a shot magnification change (X and Y scaling) is calculated based on the shot pitch obtained by the above EGA or the shot size by the above in-shot EGA. In accordance with the shot magnification change, the main controller 80 calculates the control amount of projection magnification so as to precisely match the size of a reticle pattern image in the X direction (second direction) onto a shot area on the wafer W. That is, the main controller 80 calculates the driving amount of the reticle R in the Z direction, and drives the reticle R through the magnetic levitation type two-dimensional linear actuator 34 in the Z direction (vertical direction) based on the calculation. For example, if a reticle pattern image is to be enlarged by 10 ppm from the predetermined magnification, the reticle R is driven in a direction away from the projection optical system PO by 40 $\mu$m.

Step 104

As the reticle R is driven in the Z direction as described above, the projection magnification changes. Furthermore, a positional shift of the projection area of the reticle pattern image occurs. For this reason, in step 104, the main controller 80 performs a baseline measurement and a projection magnification measurement as follows.

The main controller 80 switches the slit plate 44 through the driving mechanism 46 to a position (second position) so the exposure illumination light EL can irradiate the second slit 44b. The main controller 80 then controls the position of the wafer stage WST and the reticle stage RST through the magnetic levitation two-dimensional linear actuators 62 and 34. The reticle alignment marks RM1, RM4, RM2, RM5, RM3, and RM6 on the reticle are sequentially irradiated two at a time with the exposure illumination light EL. In addition, the main controller 80 detects the projection images of the reticle alignment marks RM1, RM4, RM2, RM5, RM3, and RM6 on the wafer W through the slits SLT1 and SLT2 of the aerial image sensor FM. The projection position of the reticle pattern image on the wafer W is thereby calculated, that is, the main controller 80 performs the reticle alignment. In detecting the projection images for this reticle alignment using the aerial image sensor FM, the main controller 80 indicates that the focus sensor 14 should be moved by an offset corresponding to the Z-direction driving amount of the reticle R. This shifts the surface of the aerial image sensor FM to the focal position of the projection optical system PO so as to prevent the images obtained by the aerial image sensor FM from being blurred by the reticle R being driven in the Z-direction. More specifically, when the main controller 80 drives the reticle R in a direction away from the projection optical system PO by 40 $\mu$m, the projection magnification is ¼, and therefore the main controller 80 instructs the focus sensor 14 that an offset of 40×⅟₁₆=2.5 $\mu$m is appropriate. Based on the output from the focus sensor 14, the main controller 80 performs feedback control via the magnetic levitation two-dimensional linear actuator 62 and drives the wafer W closer to the projection optical system PO by 2.5 $\mu$m.

The main controller 80 then moves the wafer stage WST using the magnetic levitation two-dimensional linear actuator 62 to position the slit SLT1 or SLT2 of the aerial image sensor FM directly below the alignment optical system ALG. The Z position of the surface of the aerial image sensor FM is also adjusted to the focal position of the alignment optical system ALG. Then, based on the detection signals of the alignment optical system ALG and the measurement results of the interferometer 70, the main controller 80 indirectly calculates the positional relationship between the alignment optical system ALG and the pattern image of the reticle R to be projected on the wafer W. That is, the baseline amount is calculated, and the calculation results stored in the memory 81. Furthermore, another reference mark may be formed at the midpoint in between the slits SLT1 and SLT2 of the aerial image sensor FM and the baseline amount can be calculated by detecting this reference mark with the alignment optical system ALG. In such a case, an almost accurate baseline amount can be calculated based on the detection results obtained by the alignment optical system ALG and the designed value of the baseline amount.

In the reticle alignment described above in step 104, the main controller 80 calculates the projection magnification based on the distance between the projection images of the reticle alignment marks RM1 and RM4 (RM2 and RM5 or RM3 and RM6) on the wafer W. The reticle alignment marks are respectively detected through the slits SLT1 and SLT2 of the aerial image sensor FM, and arranged side by side on the reticle R in the non-scanning direction.

Step 106

In step 106, the main controller 80 checks, with respect to the target magnification adjustment amount (10 ppm in the case described above), whether the adjustment residual error of the projection magnification is equal to or less than the permissible value (e.g., 0.2 ppm). This is based on the magnification measurement results in step 104. If the decision is negative in step 106, that is, if the adjustment residual error of the projection magnification exceeds the permissible value, the main controller 80 returns to step 102 to reset the projection magnification. Upon re-driving the reticle R in the Z-direction, the main controller 80 repeats the process and decision described above. If the decision is affirmative, i.e., the adjustment residual error of the projection magnification is equal to or less than the permissible value, the main controller 80 switches the slit plate 44 via the driving mechanism 46 to the position (first position) where the first slit 44a is irradiated with the exposure illumination light EL. After completing the switching, the process goes on to step 108.

Step 108

Figure 11:
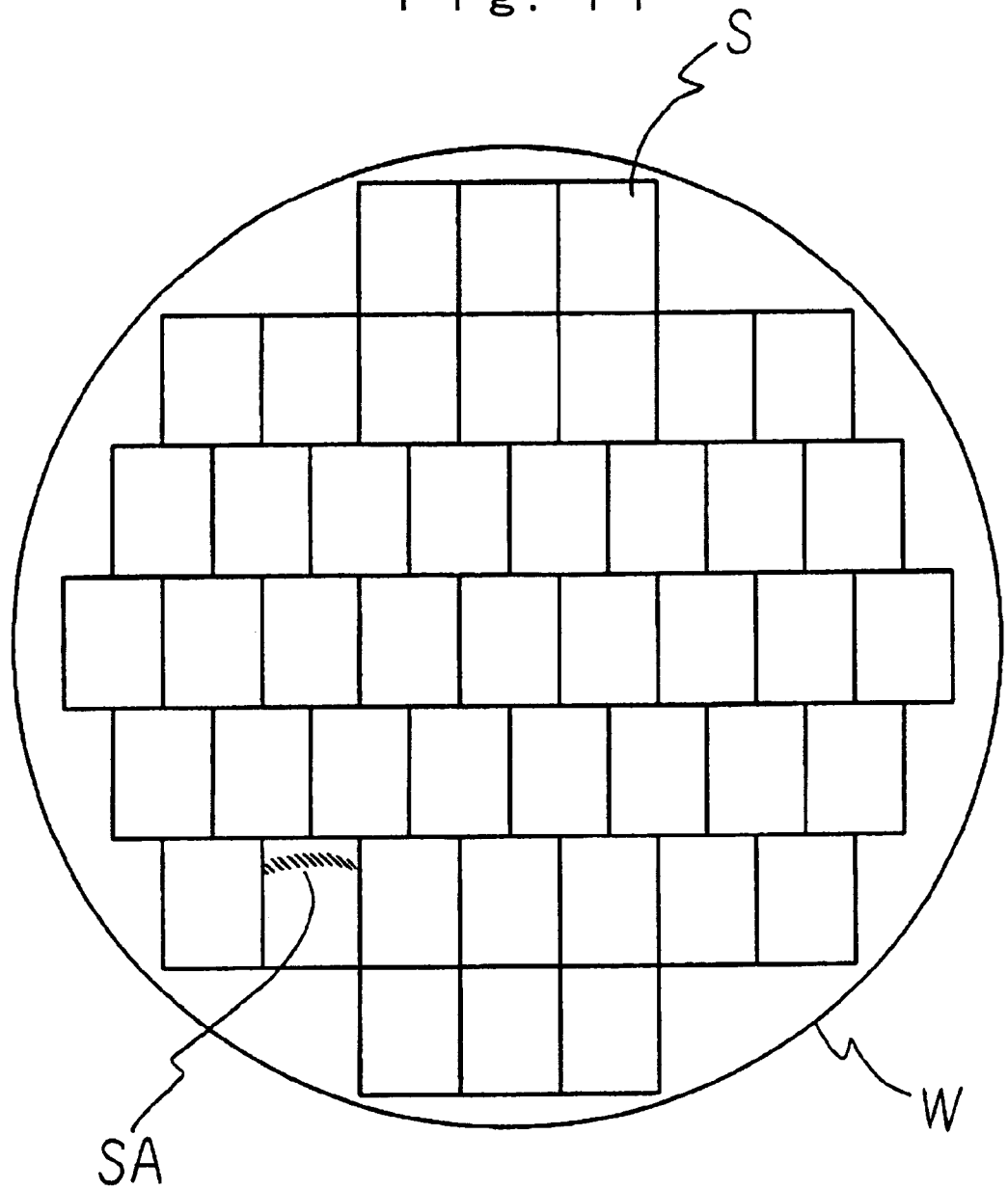
FIG. 11 is a view showing how a reticle pattern is transferred onto a plurality of shot regions on the wafer.
Figure 12:
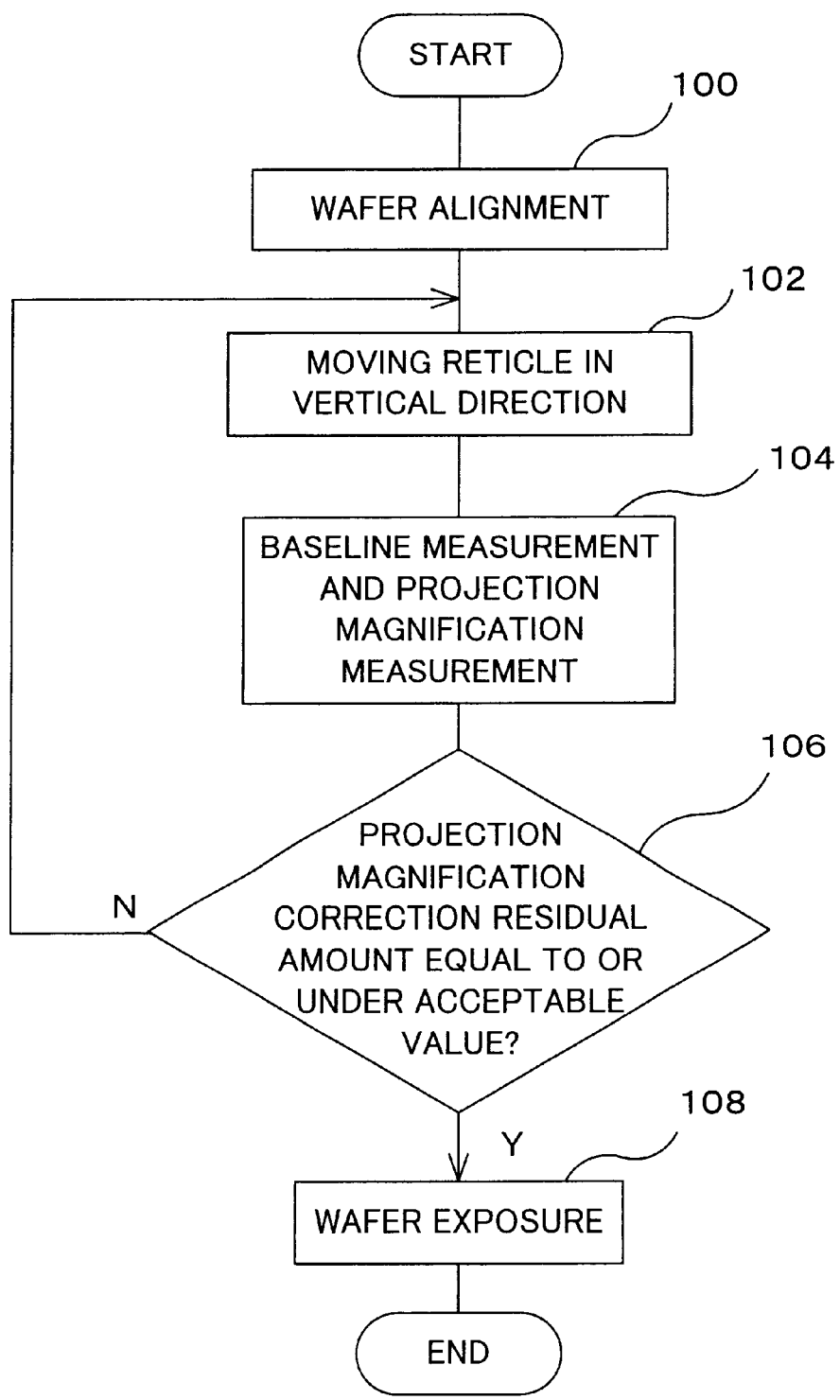
FIG. 12 is a flow chart that illustrates an exposure sequence of the exposure apparatus according to the first embodiment.

In step 108, the main controller 80 performs an exposure based on the step-and-scan method by using EUV light as the exposure illumination light EL as follows. In accordance with the positional information of each shot region on the wafer W calculated as described above, the main controller 80 positions the wafer stage WST via the magnetic levitation two-dimensional linear actuator 62 to the scanning starting position of the first shot. During the positioning, the positional information from the interferometer system 70 is monitored, and the reticle stage RST is also shifted to the scanning starting position via the magnetic levitation two-dimensional linear actuator 34. Thus, scanning exposure of the first shot is performed. In the scanning exposure, the main controller 80 controls the speed of the reticle stage RST and wafer stage WST through the magnetic levitation two-dimensional linear actuators 34 and 62. The speed of both stages are controlled by the main controller 80, so that the velocity ratio between the reticle stage RST and the wafer stage WST coincides with the projection magnification of the projection optical system PO, and exposure (transfer of the reticle pattern) is performed in a state where the velocity ratio of both stages is synchronously isochronal. Although the reticle R vertically moves upon scanning, this movement is monitored by the interferometer RIFZ and the movement of the reticle stage is controlled in order to maintain the Z position and tilt of the reticle R at the initial position. That is, the movement of the reticle stage RST is controlled to maintain the magnification residual error equal to or less than the permissible value. Thus, the projection magnification of the reticle pattern image in the scanning direction (first direction) during scanning exposure can be controlled. When scanning exposure of the first shot is completed, a stepping operation between shots is then performed to move the wafer stage WST to the scanning starting position of the second shot. Scanning exposure of the second shot is performed in the same manner as described above. In this case, in order to increase the throughput by omitting the operation of returning the reticle stage RST to the starting position, the scanning direction of exposure of the first and second shots is reversed. More specifically, when exposure of the first shot is performed from one side to the other side on the Y-axis, exposure of the second shot is performed from the other side to back to the one side. That is, alternate scanning is performed. Stepping operations between shots and scanning exposure of shots are thus repeated, and the pattern of the reticle R is transferred onto all the shot areas on the wafer W by the step-and-scan method. FIG. 11 shows a state wherein the reticle pattern is transferred onto a plurality of shot areas S on the wafer W in this manner. In the case shown in FIG. 11, the number of shots set within one row is set to an even or odd number, appropriately so as to effectively secure shots in a perfect shape on one wafer.

As described above, the exposure apparatus 10 completes the series of steps in processing a wafer W.

During the scanning exposure or alignment described earlier, the focus sensor (14a, 14b) integrally mounted on the projection optical system PO measures the distance between the surface of the wafer W and the projection optical system PO and the tilt in the X-Y plane. Furthermore, the main controller 80 controls the wafer stage WST via the magnetic levitation two-dimensional linear actuator 62 to always maintain the distance and tilt between the surface of the wafer W and the projection optical system PO constant. The Z position target value of the surface of the wafer W, however, is set to the focal position of the projection optical system PO during scanning exposure, and to the focal position of the alignment optical system ALG during alignment.

The main controller 80 synchronously moves the reticle stage RST and wafer stage WST along the Y-axis direction while adjusting the position of the reticle R in the optical axis direction (z-direction) of the projection optical system PO by controlling the magnetic levitation two-dimensional linear actuator 34. The adjustment is performed based on predetermined positional information for adjustment, which is measured by at least one of the laser interferometers RIFZ1, RIFZ2, and RIFZ3 for reticle surface measurement. This maintains the distance between the projection optical system PO and the pattern surface of the reticle R during exposure (transfer of the reticle pattern) constant. In this case, the main controller 80 may use the positional information of the reticle stage RST in the moving direction when the reticle stage RST and wafer stage WST are synchronously moving, in order to adjust the Z-direction position of the reticle stage RST. For example, in the first shot area and second shot area, at least one of the laser interferometers RIFZ1, RIFZ2, and RIFZ3 measures the first and second positional information for adjustment, thus providing the information corresponding to the moving direction of the reticle stage RST to the main controller 80. During scanning, the main controller 80 may also adjust the tilt of the reticle R by using at least two of the laser interferometers RIFZ1, RIFZ2, and RIFZ3 for reticle surface measurement. In addition, the main controller 80 may measure the vertical movement of the reticle R in advance and control the Z position and tilt of the reticle R by using the measurement value and interferometers.

According to this embodiment, therefore, the entire pattern of the reticle R is sequentially transferred onto the wafer W by scanning exposure, and upon exposure the position of the reticle R in the optical axis direction of the projection optical system is adjusted based on the positional information for adjustment. So, in spite of the fact that the reticle side of the projection optical system PO is non-telecentric, the magnification errors and positional shifts in the transferred pattern image on the wafer W caused by the displacement of the reticle R in the optical axis direction can be effectively suppressed. As a result, overlay accuracy can be improved. Also, in the case where the reticle stage RST synchronously moves from one side to the other side along the Y-axis and the positional displacement of the reticle R in the Z direction varies when it moves back due to mechanical factors (movement characteristics of the stage), control characteristics, and the like, the Z position of the reticle R can be accurately adjusted without being influenced by the variation described above. This makes it possible to effectively suppress magnification errors and positional shifts occurring in the transferred image of the pattern on the wafer W due to the Z-direction displacement of the reticle R.

As described in detail above, according to the first embodiment, the reticle R is obliquely irradiated with the exposure illumination light EL from the illumination system configured by the light source unit 12 and illumination optical system (M, 44), and the outgoing exposure illumination light of the reticle R is projected onto the wafer W by the projection optical system PO. As a result, the pattern on an area of the reticle R which is irradiated with the exposure illumination light EL is transferred onto the wafer W. During transfer of this reticle pattern, the driving unit (80, 34, 62) synchronously moves the reticle R and wafer W at a velocity ratio corresponding to the projection magnification of the projection optical system PO. With this operation, the entire pattern of the reticle R is transferred to the shot areas on the wafer W.

Prior to the transfer of this reticle pattern, the main controller 80 detects alignment marks on the wafer W by using the alignment optical system ALG. Based on the measurement results, the main controller 80 calculates the expansion/contraction amount of the wafer. Based on the mark detection result, the reticle R is driven in the Z direction to adjust (change) the projection magnification of the projection optical system PO in the non-scanning direction. The projection magnification in the scanning direction is determined by adjusting the synchronous velocity ratio between the reticle stage and the wafer stage during scanning exposure.

After completing the projection magnification change described above, the main controller 80 detects the spatial images of the reticle alignment marks RM1 to RM6 through the slits SLT1 and SLT2 (a kind of reference mark) by using the aerial image sensor FM on the wafer stage WST. It also detects the positional relationship between the two slits SLT1, SLT2, and the projection position of the reticle pattern image on the wafer stage WST. In addition, the main controller 80 detects the slit SLT1 (or SLT2) by using the alignment optical system ALG. More specifically, when the projection magnification of the projection optical system PO is changed, the main controller 80 detects (1) the positional relationship between the reference marks SLT1 and SLT2 on the wafer stage and the projection position of the pattern image of the reticle R on the wafer stage WST, and (2) the positional relationship between the reference mark SLT1 (or SLT2) on the wafer stage WST and the detection center of the alignment optical system ALG. The positional relationship between the projection position of the pattern image of the reticle R on the wafer stage WST and the detection center of the alignment optical system ALG, i.e., a so-called baseline amount, can be calculated based on the detection results (1) and (2). Therefore, the positional shift of the projection position of the reticle pattern image on the wafer W due to the change in projection magnification can be corrected, making it possible to prevent or suppress a deterioration in overlay accuracy with a change in projection magnification.

In addition, according to this embodiment, the illumination system (12, M, 44) irradiates the reticle R with EUV light having a wavelength of 5 to 15 nm as the illumination light EL. Since the reflection optical system is structured by only a plurality of reflection optical elements (M1–M4) as the projection optical system PO, the reticle pattern is transferred onto the wafer W through the projection optical system PO by using EUV light. This makes it possible to perform accurate transfer of a very fine pattern, e.g., a 100-nm L/S pattern.

Furthermore, according to this embodiment, the interferometer system 70 measures the positional relationship of the reticle stage RST and wafer stage WST within the X-Y plane with the projection optical system PO. The laser interferometer RIFZ measures the positional relationship of the reticle R in the Z direction with the projection optical system PO. The focus sensor 14 measures the positional relationship of the wafer W in the Z direction with the projection optical system PO. The reticle stage RST, wafer stage WST, and projection optical system PO, therefore, can be respectively supported by different support members without causing any problem. Since the reticle stage RST, wafer stage WST, and projection optical system PO are not required to be mechanically connected to each other, the imaging characteristics of the projection optical system PO is not affected by the reaction force generated by the movement of the wafer stage WST and reticle stage RST while accelerating or decelerating or by vibration due to the respective support members. So naturally, the reaction force generated upon movement of one stage will not affect the movement of the other stage via the support member.

In this embodiment, the slit plate 44 has the first slit 44a for irradiating a portion of a reticle pattern with the illumination light EL, and the second slit 44b for irradiating a reticle alignment mark with the illumination light EL. The driving mechanism 46 is provided to switch the first and second slits 44a and 44b with respect to the illumination light EL. This makes it possible to arrange appropriate illumination areas for exposure and alignment by using the same slit plate 44. In this case, compared with an arrangement without the slit plate 44, the arrangement with the slit plate 44 increases the degree of freedom of the sectional shape of illumination light applied from the illumination light optical system onto the reticle R. Accordingly, the degree of freedom in designing the optical elements that form the illumination light optical system increases.

The exposure illumination light EL, in this embodiment, is light in the soft X-ray region. On the wafer stage WST, the aerial image sensor FM serving as a position detection system includes the fluorescent material 63, the slits SLT1 and SLT2 formed in the surface of the fluorescent material 63 using the thin film of the reflecting layer 64, and the photoelectric conversion device PM for photoelectrically converting light emitted by the fluorescent material 63 when the exposure illumination light EL reaches the fluorescent material 63 via the slits SLT1 and SLT2. This also makes it possible to use the exposure illumination light in the soft X-ray region to measure spatial images, even though, in general, there is no such material that transmits light in the soft X-ray region. Therefore, by using this aerial image sensor FM, the projection position of the reticle pattern on the wafer stage WST can be calculated easily.

Furthermore, in this embodiment, the pattern of the reticle R is made of the EUV light (exposure illumination light) EL absorbing member formed as a film on the EUV light EL reflecting layer. Unlike the case where a multilayer film that is made of a material that reflects light in the soft X-ray region (which, in this case, is the exposure illumination light), recovering a pattern is possible in the event of a patterning failure. In addition, by appropriately selecting the material for the absorbing member above, the exposure illumination light reflecting layer and absorbing member can be arranged to have almost the same reflectivity with respect to a measurement beam (e.g., light in the visible range) from the interferometer RIFZ. This makes it possible to measure the Z-axis direction position of the reticle R with almost the same accuracy throughout the entire surface of the reticle R.

In the embodiment described above, the arcuated illumination area IA is determined by using the slit plate 44, however, the present invention is not limited to this. If each optic member of the illumination optical system can be designed so that the illumination light EL has an arcuated shape, the slit plate 44 directly below the reticle R does not have to be arranged.

Furthermore, the reticle alignment marks may be located at the positions denoted by RM7 to RM12 in FIG. 5, instead of the positions RM1 to RM6. In such a case, in the slit plate 44, only the first slit 44a will be required, thus omitting the driving mechanism 46. Alternatively, reticle alignment marks may be formed at all positions from RM1 to RM12, and all of them may be used.

As is obvious from the description above, in this embodiment, the magnification changing unit changes the projection magnification by driving the reticle R in the optical axis direction of the projection optical system PO. This unit comprises the laser interferometers RIFZ for reticle surface measurement, the magnetic levitation two-dimensional linear actuator 36, and the main controller 80, however, the present invention is not limited to this. That is, the magnification changing unit according to the present invention, may be a unit which changes the optical characteristics of a projection optical system PL by partly adjusting the curvatures of some mirrors that form the projection optical system PO, or adjusting the distance between the mirrors.

Figure 13:
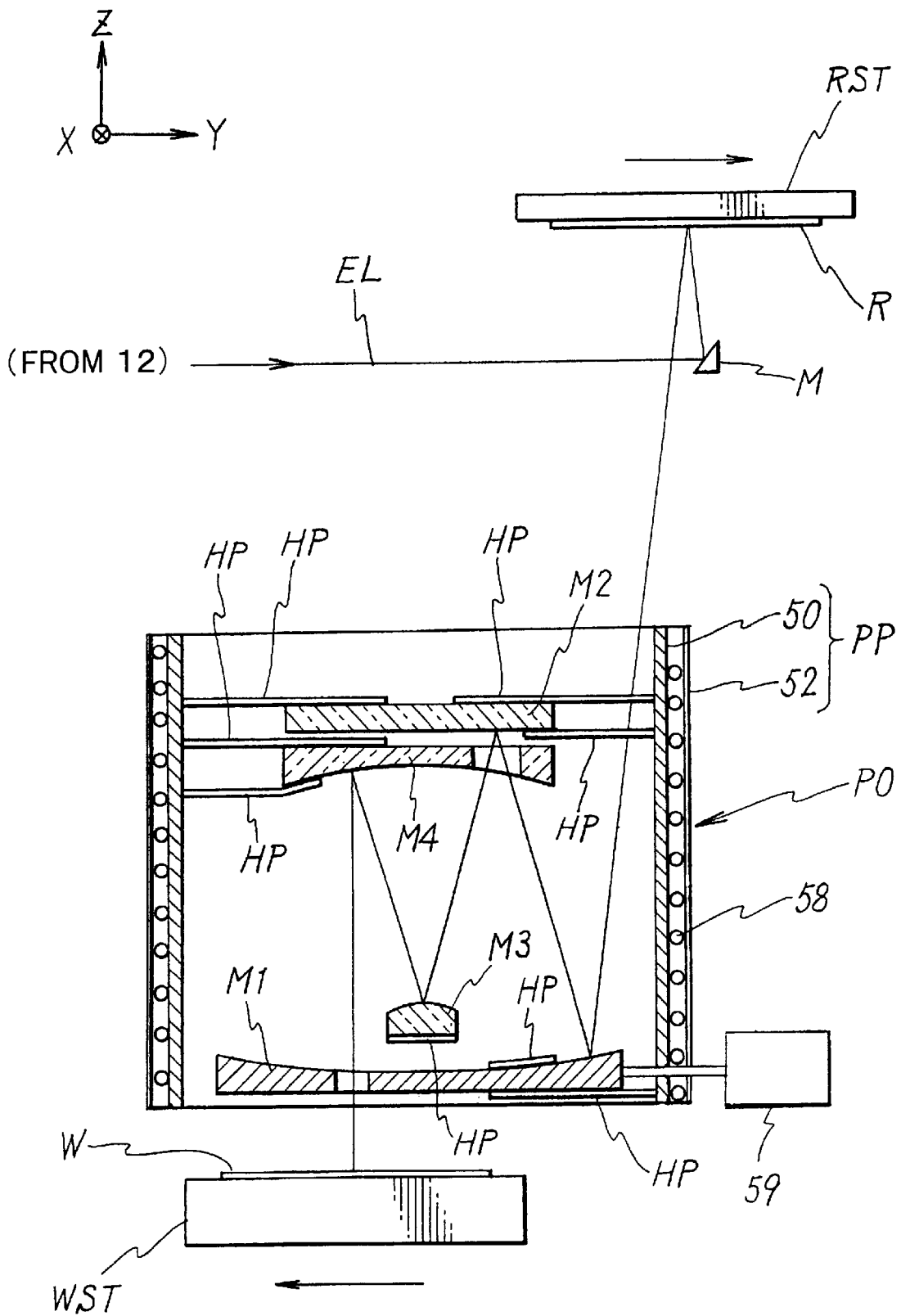
FIG. 13 is a view that illustrates a modification to the projection optical system.

FIG. 13 shows an example of the projection optical system PO having this type of optical characteristic changing unit 59, together with the reticle stage RST and wafer stage WST. Referring to FIG. 13, the first mirror M1 is made of metal, and on the surface of the mirror an EUV light reflecting layer is formed by using a multilayer film formed by alternately depositing layers made of two different materials. Beside the first mirror M1, the optical characteristic changing unit 59 for partly changing the curvature of the reflecting surface of the first mirror M1 is arranged. For example, this changing unit 59 can be formed by a mechanism having a driving shaft that pushes or pulls a portion of the rear surface side of the reflecting surface of the first mirror M1. In the case where an exposure apparatus having the changing unit 59 is adopted in the present invention, the reticle R and wafer W are synchronously moved to transfer the pattern of the reticle R onto the wafer W via the projection optical system PO. And prior to this transfer, the changing unit 59 adjusts the optical characteristics of the projection optical system PO. Upon the transfer of the reticle pattern onto the wafer W, the positional relationship between the wafer and the projection area of the pattern image during the synchronous movement of the reticle R and the wafer W can be adjusted. This adjustment compensates the shift of the projection area of the pattern image within the image field of the projection optical system PO that is caused due to adjustment of the optical characteristics as described above. This adjustment of the positional relationship can be performed by calculating the shifted amount of the projection area of the pattern image within the image field of the projection optical system PO based on the base line measurement results, after the optical characteristics have been adjusted, similar to embodiment above. Alternatively, the shifted amount or the variation of the baseline amount can be calculated based on the adjustment amount of optical characteristics and the shifted amount of the projection region for the pattern image relative thereto. This can be calculated in advance. Based on the results, the scanning starting position for exposure of each shot area on the wafer W can be adjusted. This makes it possible to prevent or sufficiently suppress deterioration in overlay accuracy due to adjustment of the optical characteristics.

As a method to change the optical characteristics of the projection optical system including image forming characteristics such as the projection magnification of a reticle pattern on a wafer, a method of controlling the magnification by changing the temperature of the reticle can be used. In the case where the projection magnification or the like is changed by such a method, the present invention can be applied and a baseline measurement can be performed. Thus, the positional shift of a pattern image due to a change in projection magnification or the like can be corrected.

In the embodiment above, the projection magnification is controlled based on the wafer alignment results. The present invention, however, is not limited to this. Other times when the projection magnification can be performed include when the projection magnification input is controlled in advance in an exposure condition setting file, when the temperature of a reticle rises during exposure due to exposure light or the like, or when the magnification is controlled in accordance with the thermal expansion amount of the reticle. In any of these cases, the reticle can be moved vertically for magnification control, and by correcting the baseline amount as in the above case the positional shift of the pattern image due a change in magnification, magnification can be corrected.

As described previously, the off-axis alignment optical system is used as a mark detection system. However, the present invention is not limited to this. In the case where an exposure position does not coincide with the irradiation position of an alignment beam, such as using a TTL (Through The Lens) or a TTR (Though The Reticle) on-axis alignment optical system as a mark detection system, performing a baseline measurement after a change in magnification is still effective.

In the above embodiment, measurement of reticle alignment marks by the aerial image sensor FM and measurement of reference marks by the alignment optical system ALG are performed at different times. However, the present invention is not limited to this. Reticle alignment marks may be detected (spatial image measurement) through the slits SLT1 and SLT2 using a large aerial image sensor at the same time when the reference marks are measured by the alignment optical system ALG. In this case, the surface of the aerial image sensor FM is preferably tilted to control the Z position of the surface of the aerial image sensor FM to the focal positions of the projection optical system PO and alignment optical system ALG at the positions of the aerial image sensor FM and reference marks.

Wafers of the same lot are processed in the same step, and hence the expansion/contraction of the wafers are expected to be almost equal. Accordingly, when one lot has 20 wafers, the calculated expansion/contraction of the first wafer does not differ much from that of the second to 20th wafers respectively. More specifically, it is empirically known that when the first wafer has expanded by 10 ppm with respect to a reference value (e.g., a design value), the second and subsequent wafers expand by about (10±0.5) ppm with respect to the reference value. In this case, therefore, after the reticle R is moved away from the projection optical system PO by 40 $\mu$m on exposing the first wafer, it suffices for the reticle R to be driven in the Z direction (vertically moved) to within the range of ±2 $\mu$m of the preceding position while exposing the second and subsequent wafers. The shift amount of the reticle image on the wafer, which corresponds to the Z-direction driving of the reticle R, is ±25 nm, therefore, even if an error as large as 10% occurs for some reason, the error is equivalent to about ±2.5 nm. This value is almost equal to the accuracy when baseline measurement is reproduced, thus eliminating the necessity for remeasurement. The second embodiment has been provided in consideration of such a situation.

Second Embodiment

Figure 14:
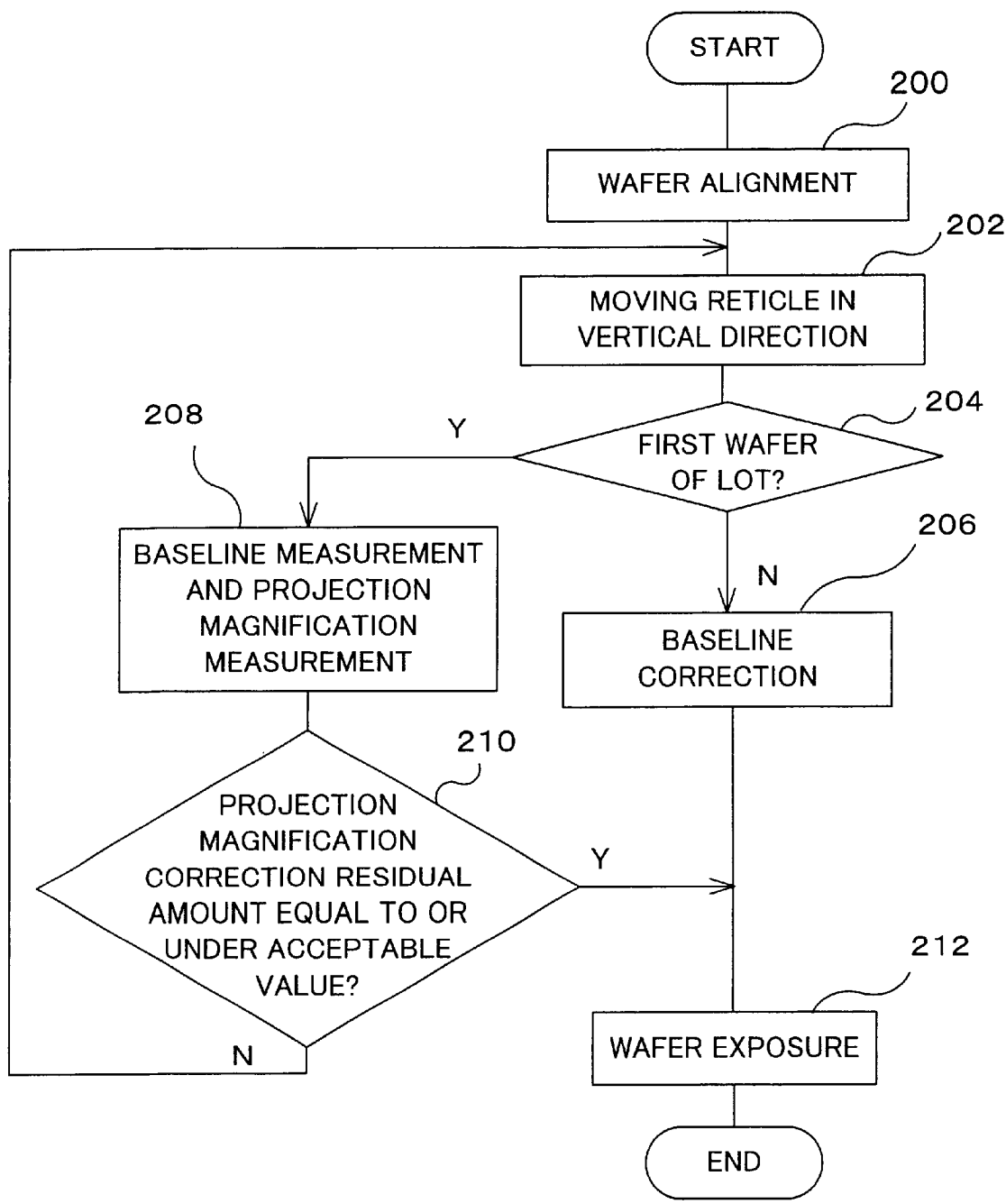
FIG. 14 is a flow chart that illustrates an exposure sequence of an exposure apparatus according to the second embodiment.

Next, the second embodiment of the present invention will be described with reference to FIG. 14. The units configuring the second embodiment are the same as those of the first embodiment. The second embodiment differs from the first embodiment only partially in the control operation performed by a main controller 80 during the exposure process for the second and subsequent layers. The following description, therefore, will have a particular emphasis on this point. Components identical or equivalent to those described in the first embodiment are designated with the same reference numerals.

The sequence shown in the flow chart of FIG. 13 starts when preparatory operations such as wafer loading (reticle loading in some case) are completed.

In step 200, the main controller 80 performs wafer alignment by EGA or the like as described above in regard to step 100. In the next step 202, the main controller 80 calculates the control amount of the projection magnification, that is the driving amount of the reticle R in the Z direction. This calculation is based on the alignment measurement results by EGA, as described above, so that the size of the reticle pattern image accurately coincides to the shot area on the wafer W. Then the main controller 80 drives the reticle R via a magnetic levitation two-dimensional linear actuator 34 based on the calculated amount in the Z direction (vertical direction).

In step 204, the main controller 80 checks whether the wafer W (that is acting as an exposure substrate) is the first wafer of a lot. If affirmative in step 204, the flow advances to step 208. The main controller 80, as explained earlier in the first embodiment and similar to the steps 106, 102 then 104 in this order, repeats the steps 210, 202, 204, 208 to 210 in a loop. This is done until the adjustment residual error of the projection magnification does not exceed the acceptable amount (e.g., 0.2 ppm). That is, the reticle R is driven in the Z-direction, baseline and projection magnification measurements are made, and the results are compared with the acceptable amount. When the adjustment residual error of the projection magnification comes within the acceptable amount, the flow then advances to step 212. In this step, similar to step 108 described earlier, the main controller 80 performs exposure by the step-and-scan method using EUV light as exposure illumination light EL, thus completing a series of steps for processing a wafer W. As described above, for the first wafer of the lot, the same operation as that of the first embodiment described earlier is performed. Accordingly, before the first wafer of the lot is exposed, therefore, the baseline amount is actually measured in step 208 and is stored in a memory 81 serving as a memory unit.

On the other hand, during exposure of the second or subsequent wafer W of the lot, the judgement in step 204 becomes negative. Therefore, a baseline measurement is not performed and hence the flow advances to step 206. In this step, the main controller 80 calculates the change in baseline amount using a proportional constant F. The proportional constant F shows the relationship between the driving amount of the reticle R in the Z-direction (which already has been determined) and the shifting amount of the reticle pattern image on the wafer W, e.g., F=12.5 nm÷1 $\mu$m=12.5× $10^{-3}$. Based on the calculation results, the main controller 80 corrects the baseline amount stored in the memory 81, i.e., updates the baseline amount.

After the baseline amount is updated, the flow advances to step 212, in which the main controller 80 performs exposure by the step-and-scan method using EUV light as the exposure illumination light EL, as in step 108 described above, thus completing a series of steps for processing a wafer W.

As is obvious from the description above, in the second embodiment, the main controller 80 incorporates the functions of a calculation unit and a second control unit as well as a control unit.

In the second embodiment described above, when transferring a reticle pattern onto a wafer other than the first wafer of a lot, the reticle R is driven in the Z direction to change the projection magnification of a projection optical system PO. Upon driving the reticle R, the main controller 80 corrects the baseline amount in the memory 81 based on the relationship between the driving amount of the reticle R in the Z-direction already determined, and the shifting amount of the reticle pattern image on the wafer W. Accordingly, just by calculation, the positional shift of the projection position of a reticle pattern image on a wafer, which occurs when the projection magnification changes, can be corrected, making it possible to prevent or sufficiently suppress deterioration in overlay accuracy due to a change in projection magnification. In addition, since a baseline measurement does not have to be repeated, the throughput can be increased.

Alternative to the judgement in step 204 described in the above embodiment, the main controller 80 may judge whether the amount of magnification change in step 202 is larger than a predetermined threshold. In such a case as well, the effects are similar to those described above. That is, the concept of correction of a baseline amount by calculation in the second embodiment is especially effective, when the driving amount range of the reticle R in the Z-direction, i.e., a projection magnification control value, is small.

The shift amount of a reticle image on the wafer W with respect to the driving amount of the reticle R in the Z-direction may be determined from the design information of the projection optical system PO. This amount, however, also may be actually measured in advance in the process of making and adjusting an exposure apparatus.

An exposure apparatus 10 of this embodiment can be made by incorporating an illumination system and projection optical system configured of a light source, a plurality of lenses, and the like in an exposure apparatus body and performing optical adjustment. Also, a reticle stage, wafer stage, two-dimensional linear actuators 34 and 62, interferometers RIFZ and 70, and the like, which are made up of many mechanical parts, are incorporated in the exposure apparatus body, and connected by wiring and piping. The respective components are then connected to a control system such as a main controller that functions as a magnification changing unit, a correction unit, and the like. Finally, overall adjustment (electrical adjustment, operation check, and the like) is performed. An exposure apparatus is preferably made in a clean room in which temperature, degree of cleanliness, and the like are controlled.

The projection optical system and illumination optical system in the first and second embodiment, are merely examples and the present invention is not limited to them. In each embodiment described above, the present invention is applied to the EUV exposure apparatus having the reflection and all reflection optical system. The present invention, however, can be suitably applied to any type of exposure apparatus. The exposure apparatus can be a scanning type or a static exposure type, or any other, so long as it has a projection optical system that is non-telecentric on the mask side and the projection position of a mask pattern image on a substrate changes upon a change in the projection magnification of the projection optical system.

The technical idea of the present invention to move a mask in the optical axis direction of the projection optical system to make a change in the projection magnification, and to correct a positional shift of a pattern image caused by the magnification change. The present invention is not limited to the EUV exposure apparatus. It can be suitably applied to any other exposure apparatus so long as it uses a combination of a reflection type mask and a reflection optical system.

In the earlier description, a baseline measurement is redone to obtain the shift amount of the projection image of a reticle pattern or a baseline variation amount. These changes occur when the image forming characteristics of the projection image of the reticle pattern or the optical characteristics of the projection optical system are proactively changed by vertically moving the reticle or using the optical characteristic changing unit or the like. The baseline amount, however, also varies as the reticle thermally expands when it absorbs exposure illumination light. Therefore, an acceptable value may be determined in advance with respect to the changing size of the reticle itself due to thermal expansion, and the reticle may be monitored during exposure. When the monitored reticle reaches the acceptable value, a baseline measurement can be redone. For example, a function of the relationship between the absorption of illumination light by the reticle and the thermal expansion of the reticle can be determined in advance by experiment or simulation, and a light flux monitor can be installed on the reticle stage. The amount of light can be then measured during wafer exchange, and an irradiation amount is calculated by using the measurement value from the light flux monitor during exposure of the wafer. The irradiation amount and the function above can be used calculate the change in size of the reticle due to thermal expansion. Furthermore, the change in size can be updated sequentially at appropriate intervals. Upon completing the exposure of the wafer, the change in size of the reticle due to thermal expansion can be checked. If the size has reached a certain value, a baseline measurement may be redone. In this case, only the projection images of reticle marks need to be measured by the aerial image sensor FM. In addition, the measurement of the changing size of the reticle can be performed after the exposure of a predetermined number of wafers, instead of just after one wafer.

The temperature distribution of a reticle can be measured based on the measurement values from the temperature sensors on the reticle stage, and the changing size of the reticle due to thermal expansion can also be estimated from the temperature distribution. In this case, regardless if the exposure illumination light is applied at that time or not, the change in size of the reticle due to thermal expansion can be accurately estimated to some extent based on actual measurements.

Likewise, each mirror of the projection optical system deforms upon absorbing illumination light, and the image forming characteristics such as the distortion of the projection optical system vary. Similar to the case of the thermal expansion of the reticle, therefore, an acceptable value for the change in the image forming characteristics or the deformation amount of each mirror may be predetermined, and these may be monitored. When the change reaches an acceptable value, a baseline measurement and measurement of the image forming characteristics may be redone with the aerial image sensor FM, as described previously. Calculating the changing size of the reticle due to thermal expansion and image forming characteristics obviously requires that the change needs to be an overall change. That is, the change during irradiation with exposure light (at which time the temperature rises) and the change when irradiation of exposure light stops (at which time the temperature drops) need to be considered. The relationship described above covers this requirement.

In each of the previous embodiments, as the illumination light EL, EUV light having a wavelength of 13.4 nm is used. Alternatively, EUV light having a wavelength of 11.5 nm may be used. In this wavelength range, a multilayer film formed by alternately depositing layers of molybdenum and beryllium is to be formed on the surface of an optic element. In the case of transferring a 70-nm L/S pattern or a 50-nm isolated pattern, a projection optical system which has a numerical aperture of about 0.1 to 0.12 is used for EUV light having a wavelength of 13.4 nm, whereas a projection optical system which has a numerical aperture of about 0.08 to 0.1 is used for EUV light having a wavelength of 11.5 nm.

The light source unit 12 in the embodiments above uses a tape target such as a copper tape. Alternatively, a gas jet target or cryotarget may be used. And instead of the laser plasma light source, SOR may be used.

In the above embodiments, the illumination area has an arcuated shape. However, the present invention is not limited to this. Even with an EUV exposure apparatus, an illumination area can be in the form of a rectangular slit. In this case, however, the number of mirrors structuring the projection optical system needs to be slightly increased.

In the first and second embodiments, the movable blind 42 and slit plate 44 (field stop) are arranged near the pattern surface of the reticle R. However, at least one of the movable blind 42 and slit plate 44 can be arranged in a plane almost conjugate to the pattern surface of the reticle R within the illumination optical system.

In each embodiment described above, the present invention is applied to the exposure apparatus using EUV light as an exposure illumination light. However, the present invention is not limited to this. For example, similar effects can be obtained by applying the present invention to an exposure apparatus using ultraviolet light as long as it has a reflection system formed only by reflection optical elements. It can also be applied to a reflection/refraction system (catadioptric system) including reflection optical elements and refraction optic elements as a projection optical system. For example, in an exposure apparatus using a vacuum ultraviolet light (VUV light) having a wavelength of about 200 nm or less, a reflection/refraction system may be used as a projection optical system. In this case, an optical characteristic changing unit like the one shown in FIG. 13, which changes the curvatures of some of reflection optical elements (e.g., a concave mirror and mirror) may be used as a magnification changing unit.

In this case, as a reflection/refraction type projection optical system, the following system can be used: a reflection/refraction system having a beam splitter and concave mirror as reflection optical elements, which is disclosed in, for example, Japan Patent Laid Open No.08-171054, U.S. Pat. No. 5,668,672 corresponding thereto, Japan Patent Laid Open No. 10-20195, and U.S. Pat. No. 5,835,275 corresponding thereto, or a reflection/refraction system having a concave mirror and the like as reflection optical elements without using any beam splitter, which his disclosed in, for example, Japan Patent Laid Open No. 8-334695, U.S. Pat. No. 5,689,377 corresponding thereto, Japan Patent Laid Open No. 10-3039, and U.S. patent application Ser. No. 873,605 (application date: Jun. 12, 1997) corresponding thereto. The above disclosures are fully incorporated herein by reference.

In addition, the reflection/refraction system disclosed in U.S. Pat. Nos. 5,031,976, 5,488,229, and 5,717,518 may be used. In the disclosure, a plurality of refraction optic elements and two mirrors (a main mirror which is a concave mirror, and a sub-mirror which is a rear mirror having a reflecting surface formed on a surface of a refraction element or plane-parallel plate which is located on the opposite side of the incident surface) are arranged coaxially. Furthermore, an intermediate image of a reticle pattern formed by the plurality of refraction optic elements is re-formed on a wafer by the main mirror and the sub-mirror. In this reflection/refraction system, the main mirror and sub-mirror are arranged following the plurality of refraction optic elements, and illumination light passes through a portion of the main mirror to be sequentially reflected by the sub-mirror and main mirror, and reaches the wafer through a portion of the sub-mirror. The above disclosures are fully incorporated herein by reference.

As a reflection/refraction projection optical system, a reduction system may be used. Such a system may have, for example, a circular image field and is double telecentric on the object surface side and the image surface side, and has a projection magnification of ¼ or ⅕. A scanning exposure apparatus having this reflection/refraction type projection optical system may be a type in which an illumination area for illumination light is determined so that it is almost centered on the optical axis of the projection optical system within its field of view. And, the illumination area extends along a direction perpendicular to the scanning direction of a reticle or wafer, and the shape may be a rectangular slit. With a scanning exposure apparatus having such a reflection/refraction type projection optical system, a fine pattern almost equal to 100-nm L/S pattern can be transferred onto a wafer with high precision, by using an $F_2$ laser beam having a wavelength of 157 nm as exposure illumination light.

The above embodiments have been described with particular emphasis on the case wherein magnification, being a part of optical characteristics is adjusted by using the optical characteristics changing unit. In this case, the projection magnification is adjusted to adjust the shift (positional shift) of the projection region of a pattern image. If the object surface side is telecentric, for example, distortion is adjusted by vertically moving the reticle. Therefore, magnification is a broad concept including distortion.

As vacuum ultraviolet light, an ArF excimer laser beam or $F_2$ laser beam is used. A harmonic may also be used. A harmonic is obtained by amplifying a single-wavelength laser beam in the infrared or visible range being emitted by a DFB semiconductor laser or fiber laser with a fiber amplifier doped with erbium (or both erbium and ytterbium), and converting the wavelength into ultraviolet light using a nonlinear optical crystal.

If, for example, the oscillation wavelength of a single-wavelength laser is set within the range of 1.51 to 1.59 $\mu$m, an eighth-harmonic whose generation wavelength falls within the range of 189 to 199 nm or a tenth-harmonic whose generation wavelength falls within the range of 151 to 159 nm is output. If the oscillation wavelength is set in the range of 1.544 to 1.553 $\mu$m, in particular, an eighth-harmonic whose generation wavelength falls within the range of 193 to 194 nm, i.e., ultraviolet light having almost the same wavelength as that of an ArF excimer laser beam, can be obtained. If the oscillation wavelength is set within the range of 1.57 to 1.58 $\mu$m, a tenth-harmonic whose generation wavelength falls within the range of 157 to 158 nm, i.e., ultraviolet light having almost the same wavelength as that of an $F_2$ laser beam, can be obtained.

If the oscillation wavelength is set within the range of 1.03 to 1.12 $\mu$m, a seventh-harmonics whose generation wavelength falls within the range of 147 to 160 nm is output. If the oscillation wavelength is set within the range of 1.099 to 1.106 $\mu$m, in particular, a seventh-harmonics whose generation wavelength falls within the range of 157 to 158 $\mu$m, i.e., ultraviolet light having almost the same wavelength as that of an $F_2$ laser beam, can be obtained. In this case, as a single-wavelength oscillation laser, for example, an ytterbium-doped fiber laser can be used.

In addition, the present invention can be applied not only to an exposure apparatus for microdevices such as semiconductor elements, but also can be applied to an exposure apparatus that transfers a circuit pattern onto a glass substrate, silicon wafer, or the like to manufacture a reticle or mask. The reticle and mask are used in an apparatus such as a light exposure apparatus, an EUV exposure apparatus, an X-ray exposure apparatus, and an electron exposure apparatus. In this case, in an exposure apparatus using DUV (Deep UltraViolet) light, VUV (Vacuum UltraViolet) light, or the like, a transmission type reticle is generally used. As a reticle substrate, silica glass, fluorine-doped silica glass, fluorite, magnesium fluoride, quartz, or the like is used. In a proximity X-ray exposure apparatus, electron exposure apparatus, or the like, a transmission type mask (stencil mask or membrane mask) is used, and a silicon wafer or the like is used as a mask substrate.

In addition to exposure apparatus used to manufacture semiconductor devices, obviously, the present invention can be applied to exposure apparatus for transferring device patterns onto glass plates, which are used to manufacture displays including liquid crystal display devices. It also can be applied to an exposure apparatus for transferring device patterns onto ceramic wafers, which is used to manufacture thin-film magnetic heads, and an exposure apparatus used to manufacture image sensing devices (CCDs and the like), and the like.

Device Manufacturing Method

A device manufacturing method using the above exposure apparatus and method in a lithographic process will next be described in detail.

Figure 15:
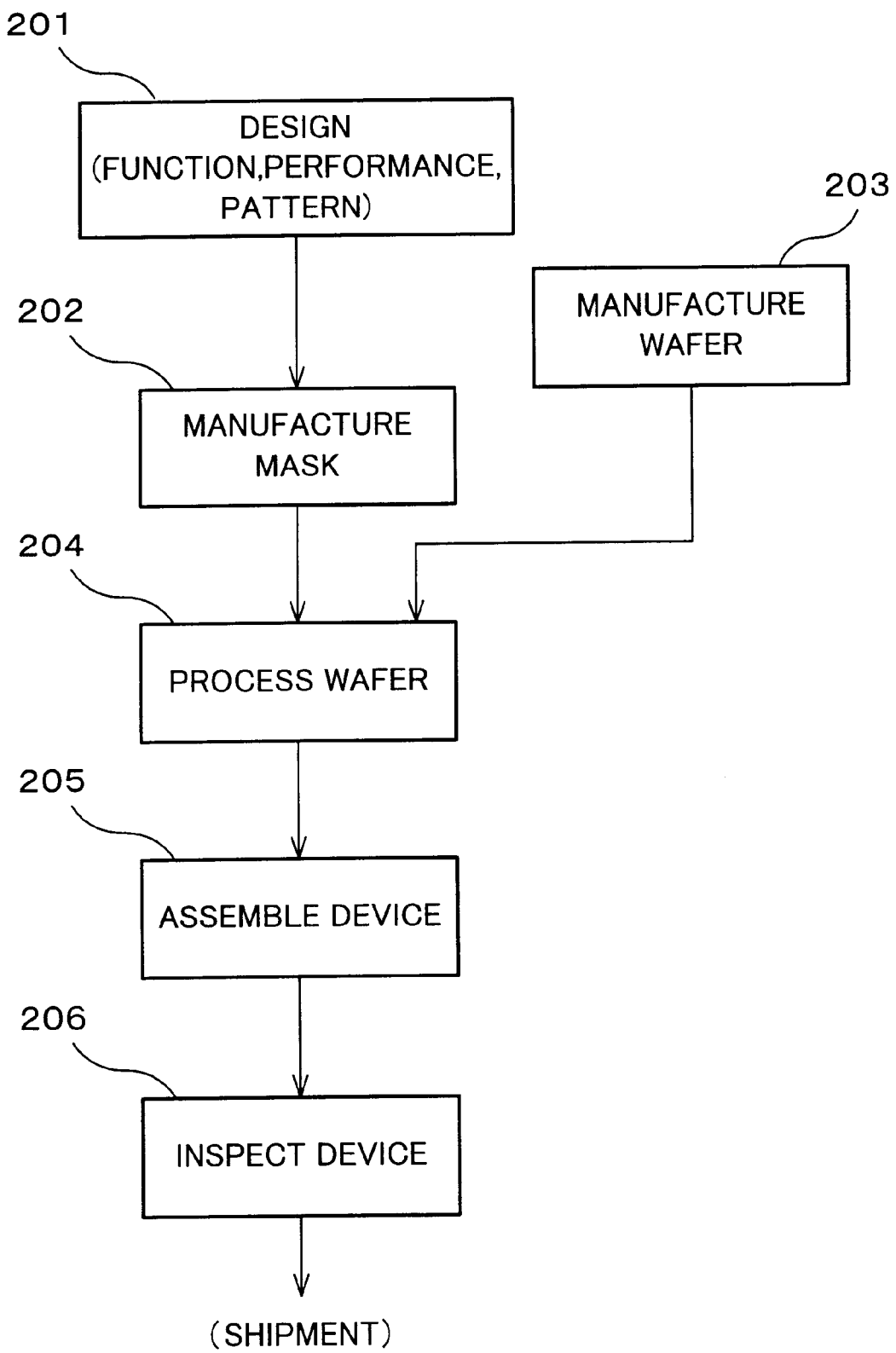
FIG. 15 is a flow chart that illustrates the device manufacturing method in one embodiment.

FIG. 15 is a flow chart showing an example of manufacturing a device (a semiconductor chip such as an IC or LSI, a liquid crystal panel, a CCD, a thin magnetic head, a micromachine, or the like). As shown in FIG. 15, in step 201 (design step), function/performance is designed for a device (e.g., circuit design for a semiconductor device) and a pattern to implement the function is designed. In step 202 (mask manufacturing step), a mask on which the designed circuit pattern is formed is manufactured. In step 203 (wafer manufacturing step), a wafer is manufacturing by using a silicon material or the like.

In step 204 (wafer processing step), an actual circuit and the like is formed on the wafer by lithography or the like using the mask and wafer prepared in steps 201 to 203, as will be described later. In step 205 (device assembly step), a device is assembled by using the wafer processed in step 204. Step 205 includes processes such as dicing, bonding, and packaging (chip encapsulation).

Finally, in step 206 (inspection step), a test on the operation of the device, durability test, and the like are performed. After these steps, the device is completed and shipped out.

Figure 16:
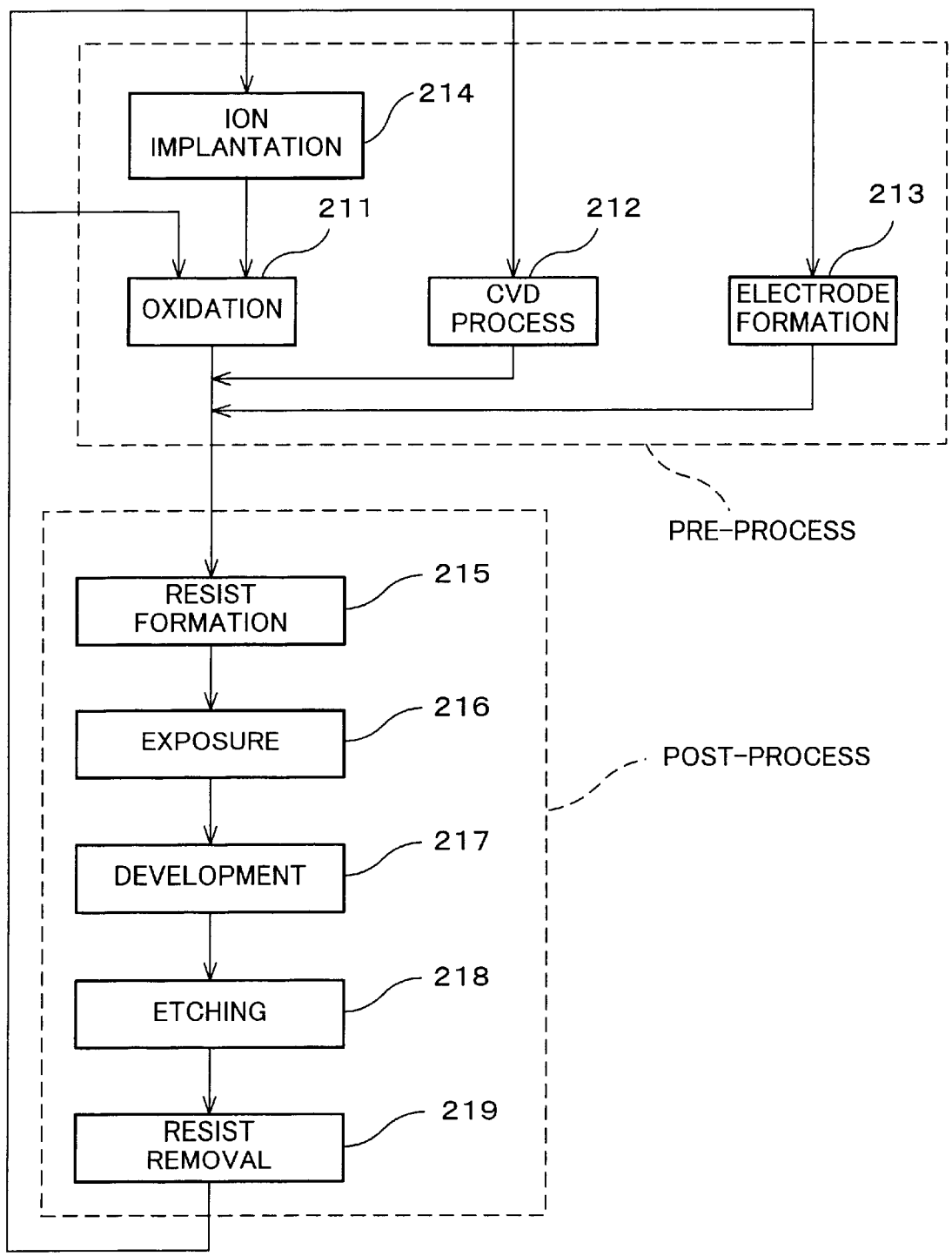
FIG. 16 is a flow chart showing processing in step 204 of FIG. 15.
Figure 17:
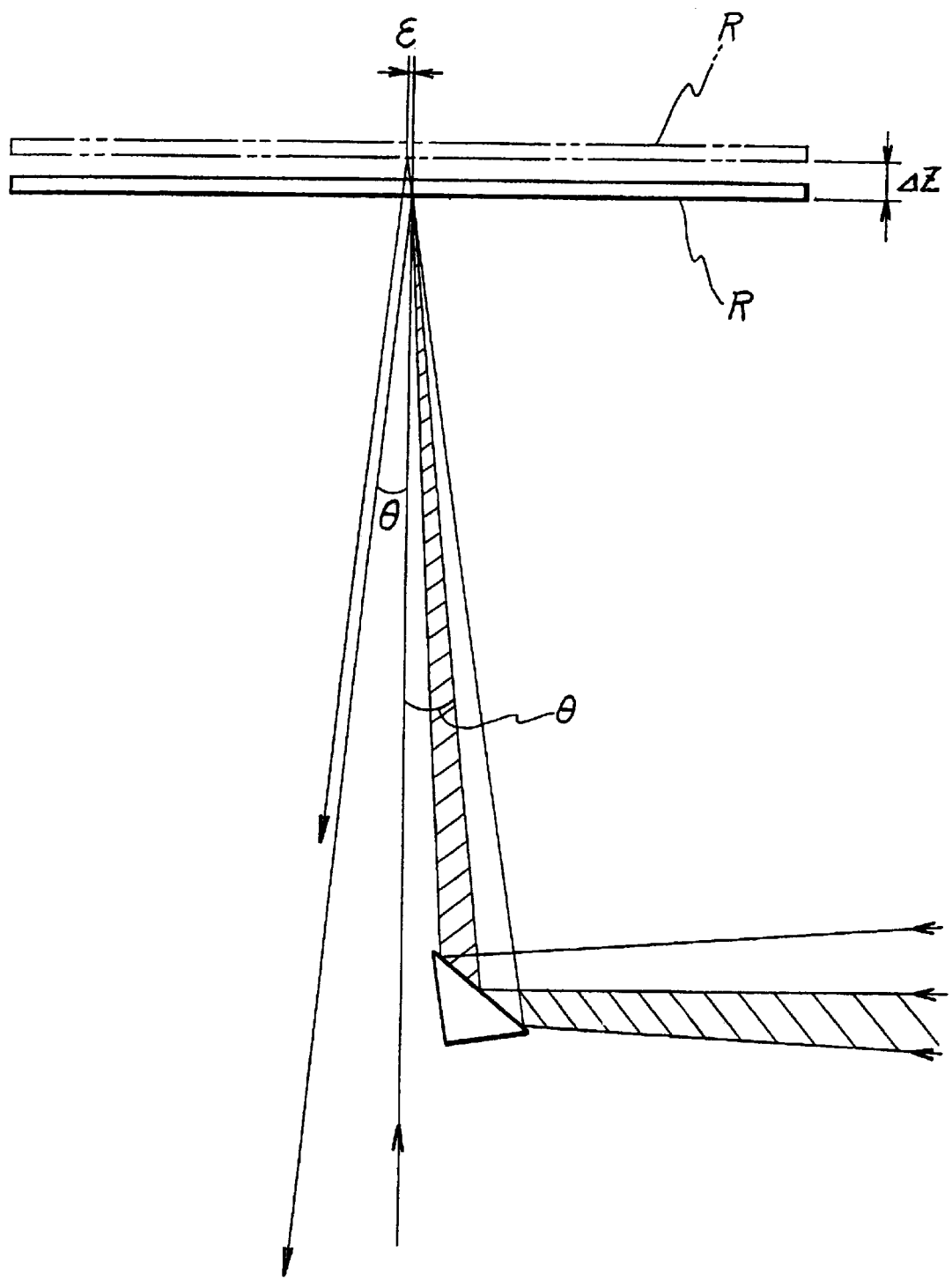
FIG. 17 is a view that illustrates the problems to be solved by the present invention.

FIG. 16 is a flow chart showing a detailed example of step 204 described above in manufacturing the semiconductor device. Referring to FIG. 16, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 215 (resist formation step), the wafer is coated with a photosensitive agent. Next, as in step 216, the circuit pattern on the mask is transcribed onto the wafer by the above exposure apparatus and method. Then, in step 217 (developing step), the exposed wafer is developed. In step 218 (etching step), an exposed member on a portion other than a portion where the resist is left is removed by etching. Finally, in step 219 (resist removing step), the unnecessary resist after the etching is removed.

By repeatedly performing these pre-process and post-process steps, multiple circuit patterns are formed on the wafer.

As described above, by using the device manufacturing method of this embodiment, the exposure apparatus 10 and exposure method described above are used in the exposure process (step 216). This makes it possible to manufacture high-integration microdevices with high productivity (high yield).

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure method for transferring a pattern formed on a mask onto a substrate through a projection optical system while synchronously moving said mask and said substrate, comprising steps of:

irradiating a pattern surface of said mask with said illumination light for exposure at a predetermined incident angle; and setting a desired projection magnification of said projection optical system in a direction perpendicular to said synchronously moving direction, and controlling a position of said substrate using a baseline of a mark detection system, said baseline obtained by consideration of a shift of a projection that occurs when said desired projection magnification is set, wherein said baseline being used to detect an alignment mark on said substrate.

2. An exposure method according to claim 1, further comprising a step of detecting said baseline corresponding to said desired projection magnification after said desired projection magnification is set.

3. An exposure method according to claim 1, further comprising a step of calculating said baseline corresponding to said desired projection based at least in part on said projection magnification.

4. An exposure method according to claim 1, wherein said mask comprises a reflection type mask and said projection optical system comprises a reflection optical system.

5. An exposure method for transferring a pattern formed on a reflection mask onto a substrate through a projection optical system which is configured only of a plurality of reflection optical elements, comprising steps of:

moving synchronously said reflection mask and said substrate;

adjusting optical characteristics of said projection optical system prior to transfer; and adjusting a positional relationship between a projection area of a pattern image and said substrate during said synchronous movement so as to compensate a shift of said projection area in an image field of said projection optical system.

6. An exposure method according to claim 5, further comprising a step of:

determining an exposure position using positional information obtained by detection of a mark on said substrate using a mark detecting system, wherein:

said step of adjusting said positional relationship between said projection area and said substrate is performed by synchronous movement of said substrate with respect to said reflection type mask;

said substrate being controlled based at least in part on said predetermined exposure position information and a baseline of said mark detection system after adjustment of said optical characteristics.

7. An exposure method according to claim 6, wherein said baseline comprises:

a measured baseline of said mark detection system, said measured baseline being measured after adjustment of said optical characteristics.

8. An exposure method according to claim 5, wherein:

said step of adjusting optical characteristics comprises a step of adjusting a projection magnification of said pattern image in a direction perpendicular to said synchronous moving direction of said substrate, said step of adjusting a projection magnification comprises a step of moving said reflection mask in a direction along an optical axis of said projection optical system based on at least one of substrate positional information obtained by detection of a plurality of marks on said substrate using said mark detection system and mask positional information obtained by detection of a plurality of marks on said reflection mask using the projection optical system.

9. An exposure method according to claim 5, further comprising a step of irradiating said reflection mask with an illumination light for exposure, said illumination light having a principal ray that tilts with respect to a pattern surface of said mask, wherein:
said illumination light being one of light in a soft X-ray region and a vacuum ultraviolet light; and
said projection optical system being non-telecentric on said mask side.

10. An exposure method which repeatedly transfers a pattern of a mask onto a substrate through a projection optical system, comprising steps of:

monitoring a change in a physical quantity that changes a baseline of a mark detection system configured to detect a mark on the substrate;

judging whether it is necessary to update said baseline of said mark detection system based at least in part on whether said physical quantity exceeds a predetermined value;

obtaining, when a judgement result is affirmative, a new baseline;

controlling, when a judgement result is affirmative, a position of said substrate using said new baseline;

controlling, when the judgement result is negative, said position of said substrate using said baseline of said mark detection system; and performing exposure.

11. An exposure method according to claim 10, wherein said change in said physical quantity comprises a change in a size of said mask due to thermal expansion.

12. An exposure method according to claim 11, wherein said change in said size of said mask due to thermal expansion is estimated based on a measurement of a temperature distribution of said mask.

13. An exposure method according to claim 10, wherein said change in said physical quantity comprises a change in an image forming characteristic of said projection optical system.

14. An exposure method according to claim 10, wherein:
said projection optical system comprises an optic system including a mirror; and
said change in said physical quantity comprises a deformation amount of said mirror.

15. An exposure method which repeatedly transfers a pattern of a mask onto a substrate through a projection optical system, said method comprising steps of:

judging whether it is necessary to update a baseline of a mark detection system based on a predetermined judgement condition, said mark detection system detecting a mark located on a substrate stage;

controlling a position of said substrate stage using, when a result of said judgement is negative, said baseline of said mark detection system, said baseline obtained prior to transfer of said pattern of said mask onto said substrate; and controlling a position of said substrate stage using, when said result of said judgement is affirmative, a new baseline to transfer said pattern of said mask onto said substrate.

16. An exposure method according to claim 15, wherein said step of judging whether it is necessary to update said baseline of said mark detection system is based at least in part on whether said substrate is a first substrate of a lot.

17. An exposure method according to claim 15, wherein said step of judging whether it is necessary to update said baseline is based at least in part on a magnification change of said projection optical system.

18. An exposure method according to claim 17 wherein said step of judging whether it is necessary to update said baseline is based at least in part on whether said magnification change has occurred.

19. An exposure method according to claim 17, further comprising a step of updating said baseline after said judgement when said magnification change has been performed and an amount of said change is greater than an acceptable amount.

20. A device manufacturing method including a lithography process, wherein said lithography process comprises a step of exposing a substrate using said exposure method in claim 1.

21. A device manufacturing method including a lithography process, wherein said lithography process comprises a step of exposing a substrate using said exposure method in claim 5.

22. A device manufacturing method including a lithography process, wherein said lithography process comprises a step of exposing a substrate using said exposure method in claim 10.

23. A device manufacturing method including a lithography process, wherein said lithography process comprises a step of exposing a substrate using said exposure method in claim 15.

24. A device manufactured using said exposure method in claim 1.

25. A device manufactured using said exposure method in claim 5.

26. A device manufactured using said exposure method in claim 10.

27. A device manufactured using said exposure method in claim 15.

28. An exposure method according to claim 6, wherein said baseline comprises:
a calculated baseline of said mark detection system, wherein said calculated baseline is calculated from the adjusted optical characteristics.

* * * * *